(12) United States Patent
Oike

(10) Patent No.: US 10,714,496 B2
(45) Date of Patent: Jul. 14, 2020

(54) SEMICONDUCTOR MEMORY

(71) Applicant: Toshiba Memory Corporation, Tokyo (JP)

(72) Inventor: Go Oike, Mie Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/287,792

(22) Filed: Feb. 27, 2019

(65) Prior Publication Data

US 2019/0371813 A1    Dec. 5, 2019

(30) Foreign Application Priority Data

May 31, 2018 (JP) .................. 2018-105254

(51) Int. Cl.

| | |
|---|---|
| *H01L 27/11582* | (2017.01) |
| *H01L 23/528* | (2006.01) |
| *H01L 23/522* | (2006.01) |
| *H01L 27/11556* | (2017.01) |
| *H01L 23/532* | (2006.01) |

(52) U.S. Cl.
CPC ...... *H01L 27/11582* (2013.01); *H01L 23/528* (2013.01); *H01L 23/5226* (2013.01); *H01L 27/11556* (2013.01); *H01L 23/53228* (2013.01); *H01L 23/53257* (2013.01); *H01L 23/53271* (2013.01)

(58) Field of Classification Search
CPC ......... H01L 27/11575; H01L 21/76892; H01L 27/11548; H01L 27/11556; H01L 23/528; H01L 27/11582; H01L 21/76838; H01L 23/5226; H01L 23/53257; H01L 23/53271; H01L 23/53228
See application file for complete search history.

(56) References Cited

U.S. PATENT DOCUMENTS

| | | | |
|---|---|---|---|
| 7,936,004 B2 | 5/2011 | Kito et al. | |
| 9,356,034 B1* | 5/2016 | Yada | H01L 27/11575 |
| 9,711,528 B2 | 7/2017 | Matsuda et al. | |
| 2016/0079069 A1* | 3/2016 | Uenaka | H01L 27/11582 |
| | | | 257/326 |
| 2016/0293539 A1* | 10/2016 | Park | H01L 27/0688 |
| 2017/0221813 A1* | 8/2017 | Kim | H01L 23/5226 |

(Continued)

FOREIGN PATENT DOCUMENTS

JP    2007-266143 A    10/2007

*Primary Examiner* — Ahmed N Sefer
(74) *Attorney, Agent, or Firm* — Kim & Stewart LLP

(57) ABSTRACT

A semiconductor memory includes a substrate and an alternating stack of first insulators and first conductors above the substrate. First to third regions are provided in this order along a direction parallel to a surface of the substrate. The alternating stack is in a dummy region at part of each of the first to third regions. Second and third conductors extend in parallel to each other in the direction above a top one of the first conductors. A plurality of first pillars extend through the second conductor. A plurality of second pillars extend through the third conductor. A columnar first contact is provided on the second conductor in the first region, and a columnar second contact is provided on the third conductor in the first region. The second and third conductors are separated from each other in the first and second regions, and connected to each other in the third region.

5 Claims, 30 Drawing Sheets

(56) References Cited

U.S. PATENT DOCUMENTS

| | | |
|---|---|---|
| 2017/0263618 A1 | 9/2017 | Shimojo |
| 2017/0263638 A1 | 9/2017 | Okada |
| 2019/0088672 A1* | 3/2019 | Tomimatsu ....... H01L 27/11582 |
| 2019/0287995 A1 | 9/2019 | Oike et al. |

* cited by examiner

SEMICONDUCTOR MEMORY

CROSS-REFERENCE TO RELATED APPLICATION

This application is based upon and claims the benefit of priority from Japanese Patent Application No. 2018-105254, filed on May 31, 2018, the entire contents of which are incorporated herein by reference.

FIELD

Embodiments described herein relate generally to a semiconductor memory.

BACKGROUND

A NAND flash memory is configured to store data in a nonvolatile manner.

DETAILED DESCRIPTION

Figure 1:
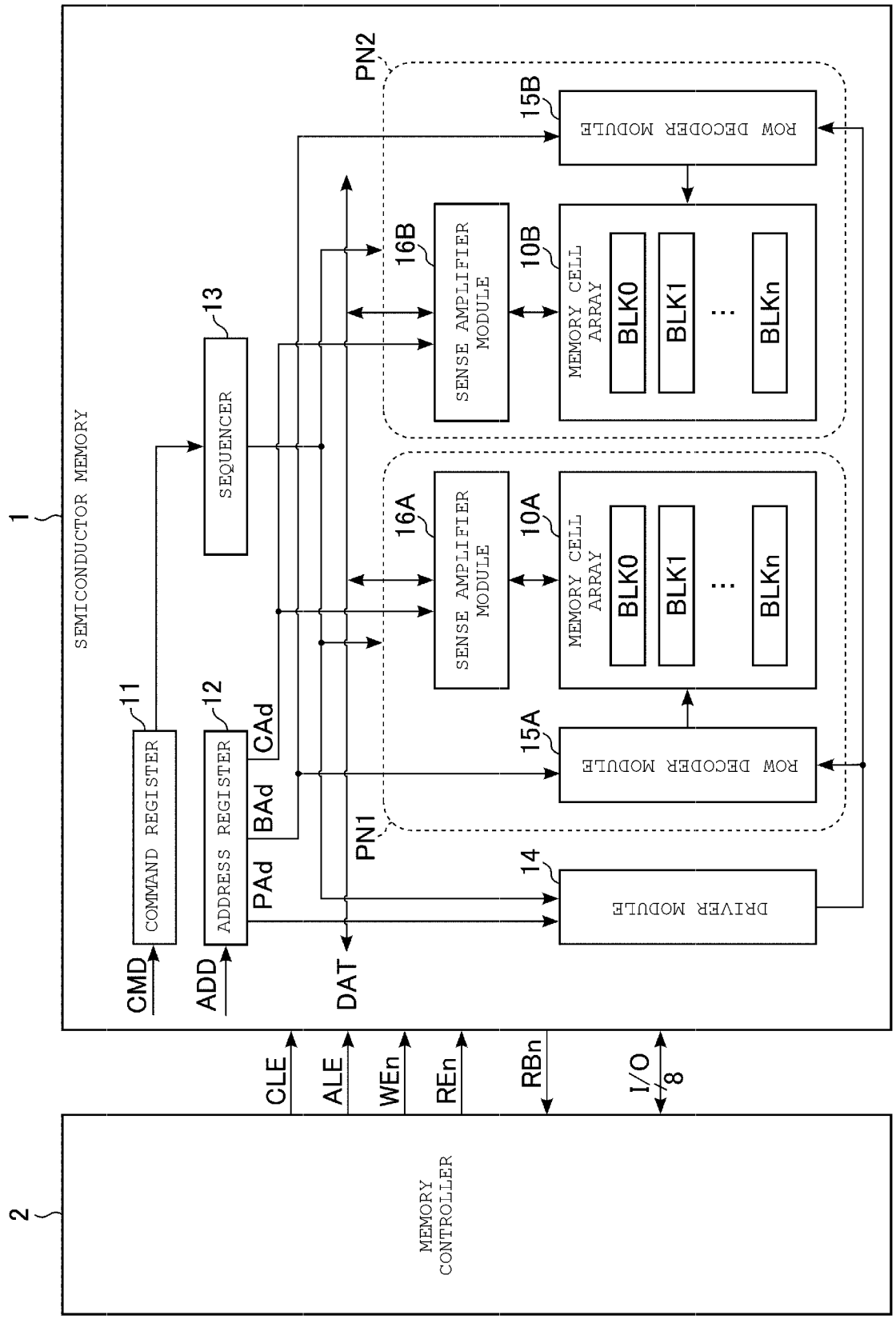
FIG. 1 is a block diagram illustrating a semiconductor memory according to a first embodiment.

Embodiments provide a semiconductor memory capable of easily estimating a resistance value of a wiring connected to a NAND string.

In general, according to an embodiment, a semiconductor memory includes a substrate and an alternating stack of first insulators and first conductors above the substrate. First to third regions are provided in this order along a direction parallel to a surface of the substrate. The alternating stack is in a dummy region at part of each of the first to third regions. Second and third conductors extend in parallel to each other in the direction above a top one of the first conductors. A plurality of first pillars is provided, and each of the first pillars extends through the alternating stack and the second conductor in the second region. A plurality of second pillars is provided, and each of the second pillars extends through the alternating stack and the third conductor in the second region. A columnar first contact is provided on the second conductor in the first region, and a columnar second contact is provided on the third conductor in the first region. The second and third conductors are separated from each other in the first and second regions, and connected to each other in the third region.

In the following, embodiments will be described with reference to the drawings. Each embodiment exemplifies a device or a method for embodying the technical concept of the present disclosure. The drawings are schematic or conceptual, and a dimension and a proportion in each drawing cannot be said to be the same as actual ones. The specific shape, structure, arrangement, or other features of any element is not intended to limit the technical concept of the present disclosure.

In the following description, elements having the substantially same function and configuration are given the same reference numeral. Numbers after a letter forming a reference sign are referred to by a reference sign including the same letter, and are used to differentiate elements having the same configuration. Similarly, letters after a number forming a reference sign are referred to by a reference sign including the same number, and are used to differentiate elements having the same configuration. In a case where elements indicated by reference signs including the same letter or number are not required to be differentiated from each other, such elements are referred to by a reference sign including only the letter or the number.

1. First Embodiment

In the following, a semiconductor memory 1 according to a first embodiment will be described.

1-1. Configuration of Semiconductor Memory 1

1-1-1. Overall Configuration of Semiconductor Memory 1

The semiconductor memory 1 is, for example, a NAND flash memory configured to store data in a nonvolatile manner. The semiconductor memory 1 is controlled by, for example, an external memory controller 2. FIG. 1 illustrates a configuration example of the semiconductor memory 1 according to the first embodiment.

As illustrated in FIG. 1, the semiconductor memory 1 includes, for example, memory cell arrays 10A and 10B, a command register 11, an address register 12, a sequencer 13, a driver module 14, row decoder modules 15A and 15B, and sense amplifier modules 16A and 16B.

In the following, a set of the memory cell array 10A, the row decoder module 15A, and the sense amplifier module 16A will be referred to as a plane PN1. A set of the memory cell array 10B, the row decoder module 15B, and the sense amplifier module 16B will be referred to as a plane PN2.

Each of the memory cell arrays 10A and 10B stores data in a nonvolatile manner. A plurality of bit lines and a plurality of word lines are provided in each of the memory cell arrays 10A and 10B. Each of the memory cell arrays 10A and 10B includes a plurality of blocks BLK0 to BLKn (where n is an integer of 1 or greater). The block BLK is an aggregate of nonvolatile memory cells, and is used as, for example, a data erase unit. Each memory cell is associated with a single bit line and a single word line. A detailed configuration of the memory cell array 10 will be described later.

The command register 11 holds commands CMD which is received from the memory controller 2 by the semiconductor memory 1. The commands CMD include, for example, commands for causing the sequencer 13 to perform a read operation, a write operation, an erase operation, and the like.

The address register 12 holds address information ADD which is received from the memory controller 2 by the semiconductor memory 1. The address information ADD includes, for example, a block address BAd, a page address PAd, and a column address CAd. For example, the block address BAd, the page address PAd, and the column address CAd are respectively used to select a block BLK, a word line, and a bit line.

The sequencer 13 controls the overall operation of the semiconductor memory 1. The sequencer 13 can separately control the plane PN1 and the plane PN2. For example, the sequencer 13 controls the driver module 14 and the plane PN1 based on the command CMD held in the command register 11, so as to perform a read operation, a write operation, an erase operation, and the like on the plane PN1. Similarly, the sequencer 13 may perform a read operation, a write operation, an erase operation, and the like on the plane PN2.

The driver module 14 generates voltages used for a read operation, a write operation, an erase operation, and the like. The driver module 14 applies a generated voltage to, for example, a signal line corresponding to a selected word line based on the page address PAd held in the address register 12.

The row decoder modules 15A and 15B respectively correspond to the memory cell arrays 10A and 10B. The row decoder module 15 selects one block BLK in the corresponding memory cell array 10 based on the block address BAd held in the address register 12. The row decoder module 15 transmits the voltage applied to the signal line corresponding to the selected word line, to the selected word line in the selected block BLK.

The sense amplifier modules 16A and 16B respectively correspond to the memory cell arrays 10A and 10B. In a write operation, the sense amplifier module 16 applies a desired voltage to a bit line provided in the corresponding memory cell array 10 according to write data DAT received from the memory controller 2. In a read operation, the sense amplifier module 16 evaluates data stored in a memory cell based on a voltage of a bit line, reads the evaluation result, and transmits the determination result to the memory controller 2 as the data DAT.

Communication between the semiconductor memory 1 and the memory controller 2 is performed based on, for example, a NAND interface standard. For example, a command latch enable signal CLE, an address latch enable signal ALE, a write enable signal WEn, a read enable signal REn, a ready/busy signal RBn, and an input/output signal I/O are used in communication between the semiconductor memory 1 and the memory controller 2.

The command latch enable signal CLE is a signal indicating that the input/output signal I/O received by the semiconductor memory 1 is the command CMD. The address latch enable signal ALE is a signal indicating that the input/output signal I/O received by the semiconductor memory 1 is the address information ADD. The write enable signal WEn is a signal for instructing the semiconductor memory 1 to input the input/output signal I/O. The read enable signal REn is a signal for instructing the semiconductor memory 1 to output the input/output signal I/O.

The ready/busy signal RBn is a signal telling the memory controller 2 whether the semiconductor memory 1 is in a ready state to receive a command from the memory controller 2 or in a busy state unable to receive a command. The input/output signal I/O is, for example, a signal with an 8-bit width, and may include the command CMD, the address information ADD, the data DAT, and the like.

A semiconductor device may be configured through a combination of the semiconductor memory 1 and the memory controller 2 explained above. Such a semiconductor device may include, for example, a memory card such as an SD™ card, or a solid state drive (SSD).

The first embodiment shows the semiconductor memory 1 having two planes (planes PN1 and PN2). Alternatively, the semiconductor memory 1 may include three or more planes. The configuration of the plane is not limited to the above-described configuration, and the plane may only need to include the memory cell array 10.

1-1-2. Circuit Configuration of Semiconductor Memory 1

Figure 2:
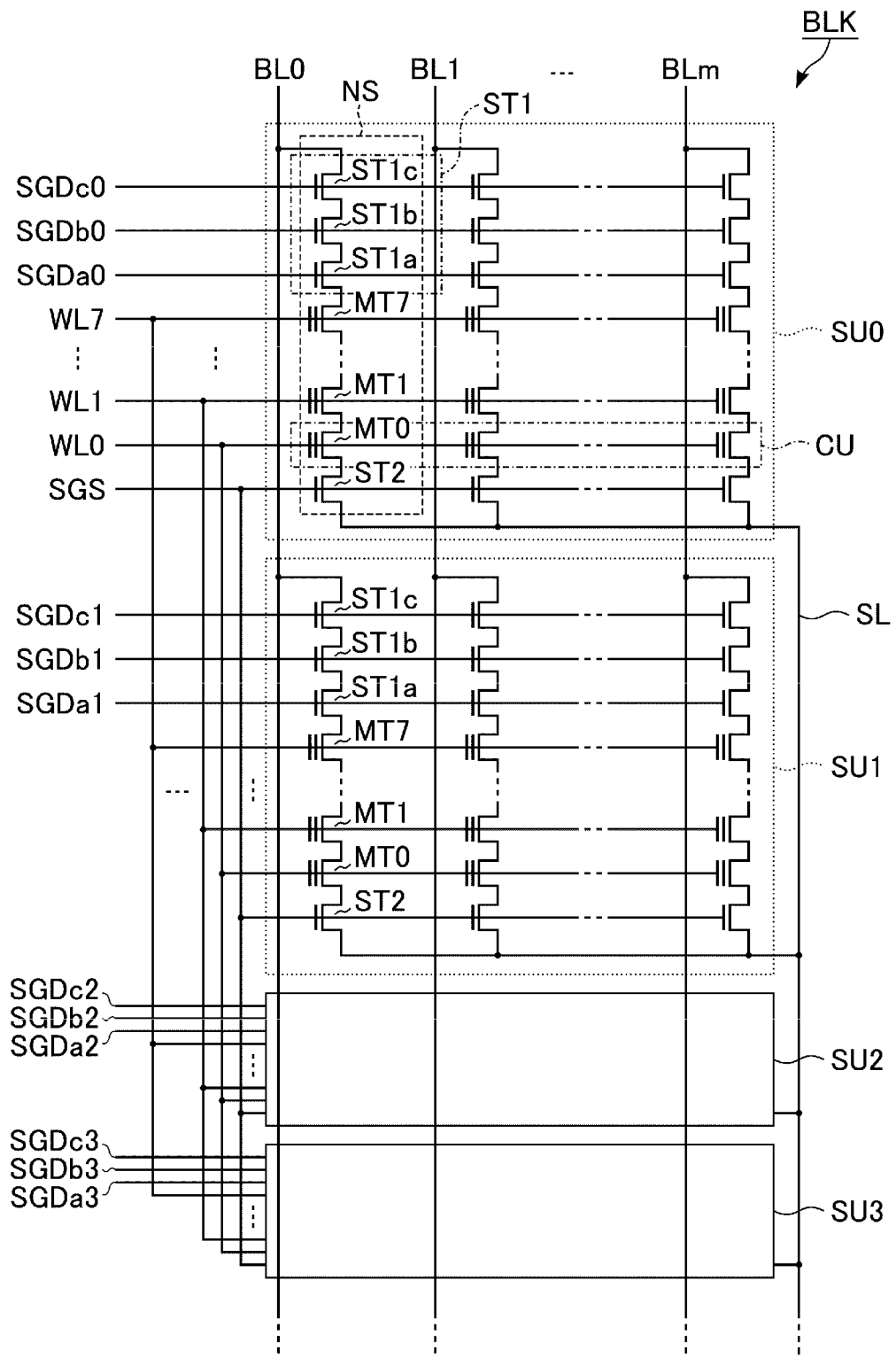
FIG. 2 is a circuit diagram illustrating an example of a circuit configuration of a memory cell array of the semiconductor memory according to the first embodiment.

FIG. 2 illustrates an example of a circuit configuration of the memory cell array 10 of the semiconductor memory 1 according to the first embodiment by extracting one block BLK from a plurality of blocks BLK in the memory cell array 10.

As illustrated in FIG. 2, the block BLK includes, for example, four string units SU0 to SU3. Each string unit SU includes a plurality of NAND strings NS respectively associated with bit lines BL0 to BLm (where m is an integer of 1 or greater).

The NAND string NS includes, for example, memory cell transistors MT0 to MT7, and select transistors ST1 and ST2. The select transistor ST1 is, for example, a set of select transistors ST1$a$, ST1$b$, and ST1$c$ which are connected in series to each other. The number of transistors in the select transistor ST1 may be designed to be any number.

The memory cell transistor MT includes a control gate and a charge storage layer, and holds data in a nonvolatile manner. Each of the select transistors ST1 and ST2 is used to select the string unit SU during various operations.

In each NAND string NS, the memory cell transistors MT0 to MT7 are connected in series to each other between a source of the select transistor ST1$a$ and a drain of the select transistor ST2. The control gates of the memory cell transistors MT0 to MT7 in the same block BLK are respectively connected in common to the word lines WL0 to WL7.

In each NAND string NS, a drain of the select transistor ST1$c$ is connected to the corresponding bit line BL. In other words, one end of the select transistor ST1 is connected to one end of the memory cell transistors MT0 to MT7 connected in series to each other, and the other end of the select transistor ST1 is connected to the corresponding bit line BL.

Gates of the select transistors ST1$a$, ST1$b$, and ST1$c$ in the string unit SU0 are respectively connected in common to select gate lines SGDa0, SGDb0, and SGDc0. Gates of the select transistors ST1$a$, ST1$b$, and ST1$c$ in the string unit SU1 are respectively connected in common to select gate lines SGDa1, SGDb1, and SGDc1.

Gates of the select transistors ST1$a$, ST1$b$, and ST1$c$ in the string unit SU2 are respectively connected in common to select gate lines SGDa2, SGDb2, and SGDc2. Gates of the select transistors ST1$a$, ST1$b$, and ST1$c$ in the string unit SU3 are respectively connected in common to select gate lines SGDa3, SGDb3, and SGDc3.

Sources of the select transistor ST2 in the same block BLK are connected in common to a source line SL. Gates of the select transistors ST2 in the same block BLK are connected in common to a select gate line SGS.

In the circuit configuration of the memory cell array 10 described above, drains of the select transistors ST1$c$ corresponding to the same column among a plurality of blocks BLK are connected to the same bit line BL. The source line SL is connected in common to, for example, the plurality of blocks BLK.

A plurality of memory cell transistors MT connected to a common word line WL in a single string unit SU will be referred to as, for example, a cell unit CU. A storage capacity of each cell unit CU changes based on the number of bits of data stored in the memory cell transistor MT.

For example, a single cell unit CU stores 1-page data in a case where each memory cell transistor MT stores 1-bit data, and stores 2-page data in a case where each memory cell transistor MT stores 2-bit data.

Accordingly, "1-page data" is defined as the total amount of data stored in the cell unit CU configured from memory cell transistors MT each storing 1-bit data.

A circuit configuration of the memory cell array 10 of the semiconductor memory 1 according to the first embodiment is not limited to the above-described configuration. For example, the number of memory cell transistors MT and select transistors ST1 and ST2 in each NAND string NS may be designed to be any number. The number of string units SU in each block BLK may be designed to be any number.

1-1-3. Structure of Semiconductor Memory 1

In the following, a description will be made of an example of a structure of the semiconductor memory 1 according to the first embodiment. The semiconductor memory 1 according to the first embodiment has a structure in which circuits such as the sense amplifier module 16 are provided between a semiconductor substrate and the memory cell array 10, that is, under the memory cell array 10.

In the drawings referred to below, an X direction corresponds to an extension direction of the word line WL, a Y direction corresponds to an extension direction of the bit line BL, and a Z direction corresponds to the orthogonal direction to a front surface of a semiconductor substrate 20 on which the semiconductor memory 1 is formed.

In cross-sectional views referred to below, for better understanding of the drawings, elements such as an insulating layer (interlayer insulating film), a wiring, and a contact are not illustrated as appropriate. In plan views, for better understanding of the views, hatching is added as appropriate. Hatching added to the plan views is not necessarily associated with a material or a characteristic of a hatched element.

Planar Layout of Memory Cell Arrays 10A and 10B

Figure 3:
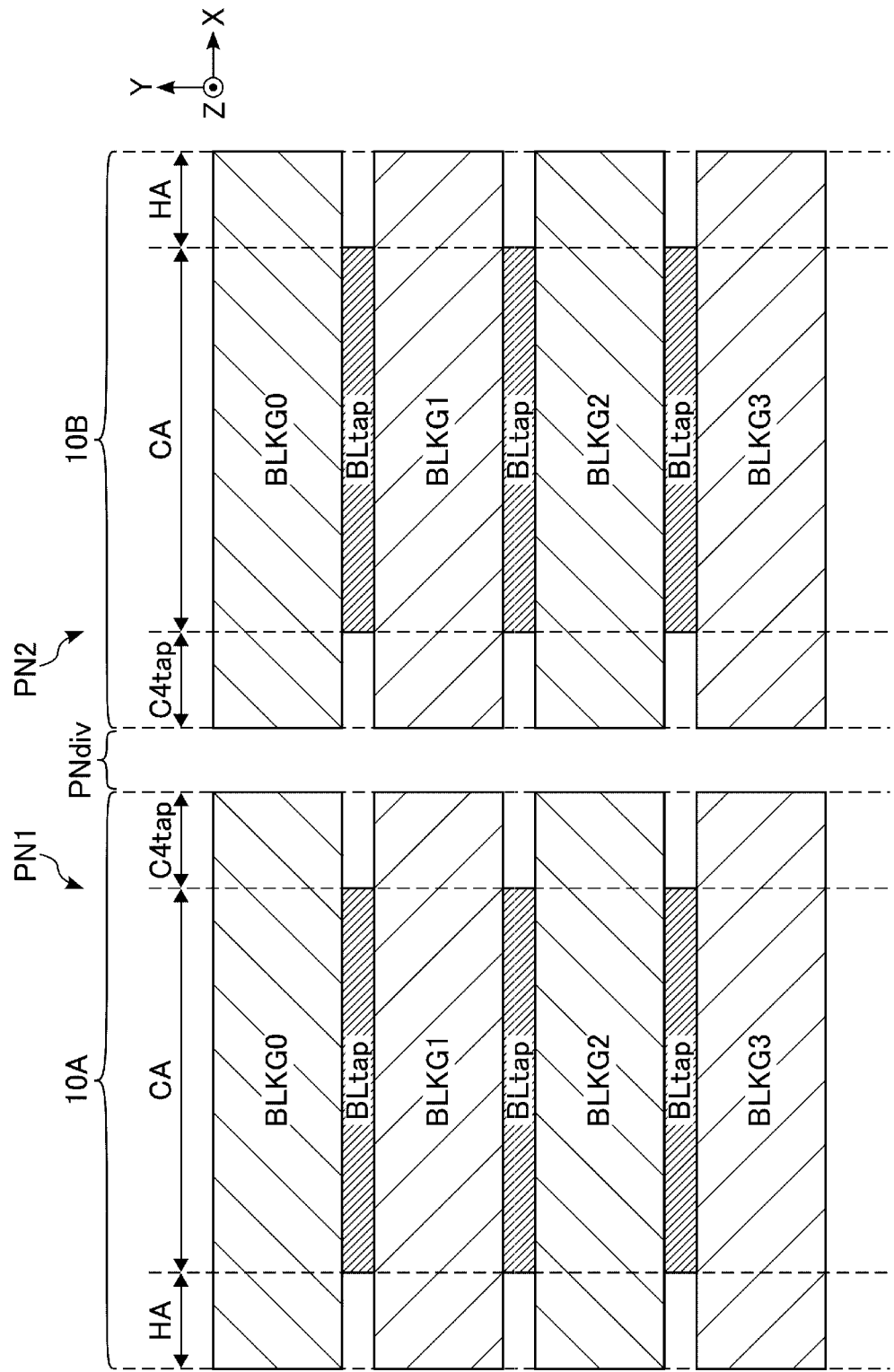
FIG. 3 illustrates a plan view of an example of the memory cell array of the semiconductor memory according to the first embodiment.

FIG. 3 illustrates an example of a planar layout of the memory cell arrays 10A and 10B of the semiconductor memory 1 according to the first embodiment.

As illustrated in FIG. 3, a region of the memory cell array 10A corresponding to the plane PN1 and a region of the memory cell array 10B corresponding to the plane PN2 are adjacent to each other in the X direction. A plane separation region PNdiv is provided between the region of the memory cell array 10A and the region of the memory cell array 10B.

Each of the regions corresponding to the memory cell arrays 10A and 10B may be divided into, for example, a cell region CA, a lead region HA, and a C4 connection region C4tap along the X direction.

The cell region CA is a region in which a plurality of NAND strings NS are formed. The lead region HA is a region in which contacts are formed for electrically connecting the row decoder module 15 with select gate lines SGD and SGS and the word lines WL connected to the NAND strings NS. The C4 connection region C4tap is a region in which contacts for electrically connecting, for example, the source line SL connected to the NAND string NS or a power line or a signal line provided on the memory cell array 10 to circuits provided under the memory cell array 10 are formed.

Each of the C4 connection region C4tap of the memory cell array 10A and the C4 connection region C4tap of the memory cell array 10B is in contact with the plane separation region PNdiv. Each of the lead region HA of the memory cell array 10A and the lead region HA of the memory cell array 10B is separated from the plane separation region PNdiv. In each of the memory cell arrays 10A and 10B, the cell region CA is disposed between the lead region HA and the C4 connection region C4tap.

Each of the memory cell arrays 10A and 10B includes, for example, block groups BLKG0 to BLKG3. Each block group BLKG extends in the X direction, and the block groups BLKG0 to BLKG3 are arranged in the Y direction. The number of block groups BLKG in each memory cell array 10 may be designed to be any number. The block group BLKG includes a plurality of blocks BLK. For example, a BL connection region BLtap is provided between the block groups BLKG adjacent to each other in the cell region CA.

The BL connection region BLtap is a region in which a contact for electrically connecting the bit line BL connected to the NAND string NS to the sense amplifier module 16 disposed under the memory cell array 10 is formed.

Figure 4:
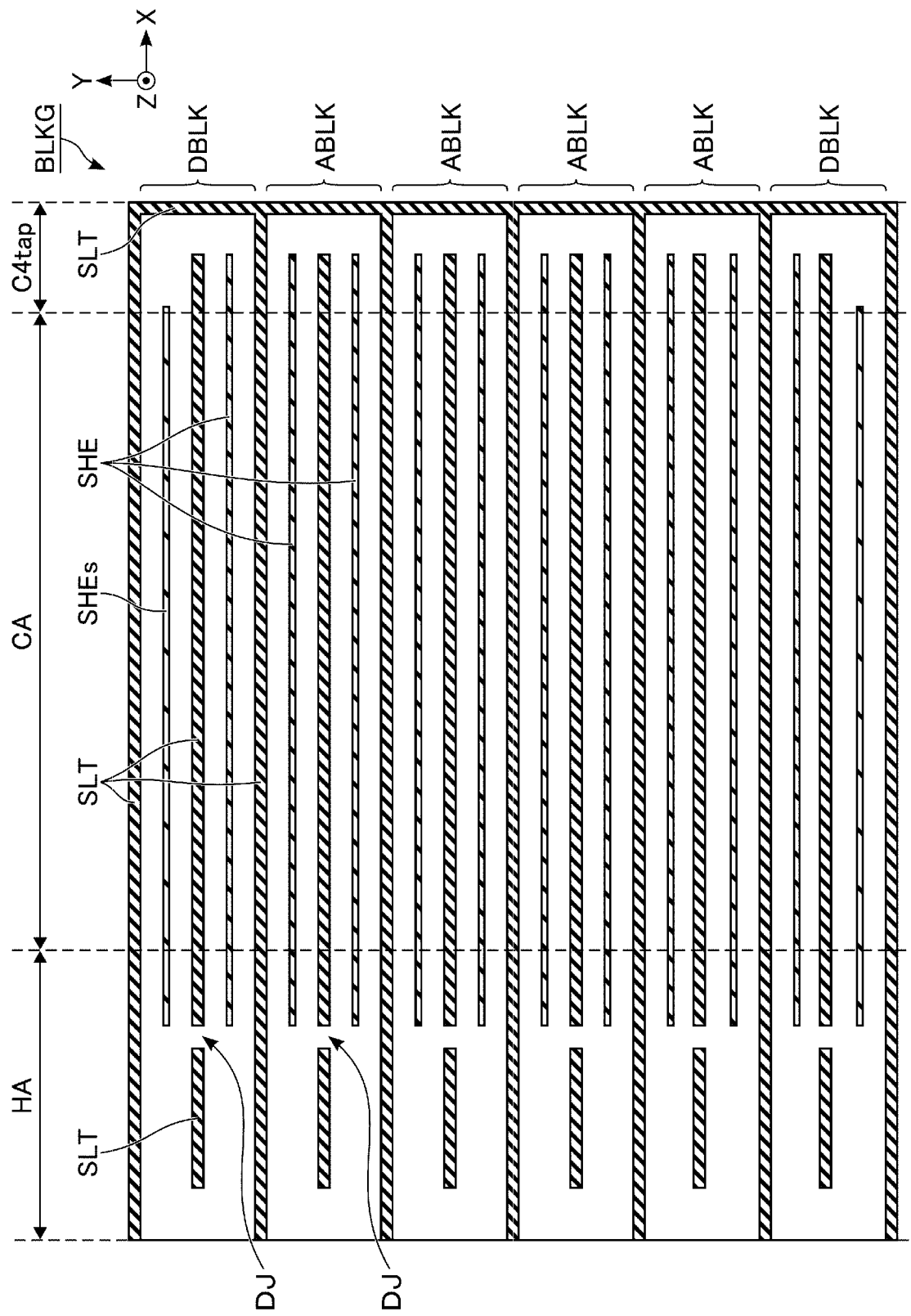
FIG. 4 illustrates another plan view of an example of the memory cell array of the semiconductor memory according to the first embodiment.

FIG. 4 illustrates an example of a more detailed planar layout of the memory cell array 10 of the semiconductor memory according to the first embodiment by extracting a single block group BLKG provided in the memory cell array 10A.

As illustrated in FIG. 4, the block group BLKG includes, for example, four active blocks ABLK and two dummy blocks DBLK.

The active block ABLK is the block BLK used to store data. The total number of active blocks ABLK in each memory cell array 10 corresponds to the total number of blocks BLK in each memory cell array 10.

A dummy block DBLK is a block BLK not used to store data. A dummy block DBLK is provided to maintain the shape of a slit SLT or a memory pillar MP, which will be described later.

Each of the active block ABLK and the dummy block DBLK extends in the X direction. The four active blocks ABLK are arranged in the Y direction, and are disposed between the two dummy blocks DBLK.

Each of the active blocks ABLK and the dummy blocks DBLK is provided in, for example, a region of which two sides extending in the X direction are in contact with a slit SLT (hereinafter, referred to as a horizontal-direction slit SLT) and one side extending in the Y direction is in contact with a slit SLT (in the following, referred to as a vertical-direction slit SLT).

Specifically, the vertical-direction slit SLT is provided at one end in the X direction of a block group BLKG. A plurality of horizontal-direction slits SLT arranged side-by-side in the Y direction are in contact with the vertical-direction slit SLT provided at the one end.

In other words, the slit SLT is provided in a comb shape in which the other end in the X direction is open. Each dummy block DBLK and active block ABLK is provided in a region between horizontal-direction slits SLT adjacent to each other in the Y direction among a plurality of slits SLT in the comb-shaped slit SLT.

The vertical-direction slit SLT may be provided at the other end in the X direction of the block group BLKG. In this case, a plurality of horizontal-direction slits SLT arranged side-by-side in the Y direction may be in contact with or separated from the vertical-direction slit SLT at the other end.

An active block ABLK includes, for example, more horizontal-direction slits SLT which extend from the lead region HA to the C4 connection region C4tap in the X direction, in the region between adjacent horizontal-direction slits SLT arranged side-by-side. The horizontal-direction slit SLT has a slit gap DJ in the lead region HA. For example, a slit SHE extending in the X direction is disposed between the horizontal-direction slits SLT arranged side-by-side in the Y direction. In the active block ABLK, the slit SHE extends, for example, from the vicinity of the slit gap DJ of the lead region HA to the C4 connection region C4tap.

In a dummy block DBLK, for example, a slit SHEs extending in the X direction is disposed between the horizontal-direction slits arranged in the Y direction. The slit SHEs is formed simultaneously with, for example, the slit SHE. The slit SHEs is provided such that the length of its portion overlapping the C4 connection region C4tap is shorter than that of the slit SHE.

As illustrated in FIG. 4, a dummy block DBLK may include a slit SHE, and at least one slit SHEs may be provided in at least the dummy block DBLKs in the block group BLKG.

The number of the active blocks ABLK and of the dummy blocks DBLK in each block group BLKG may be designed to be any number. The dummy block DBLK may be disposed between the active blocks ABLK in the Y direction.

The number of horizontal-direction slits SLT in the active block ABLK and in the dummy block DBLK may differ.

Structure of Memory Cell Array 10 in Cell Region CA

Figure 5:
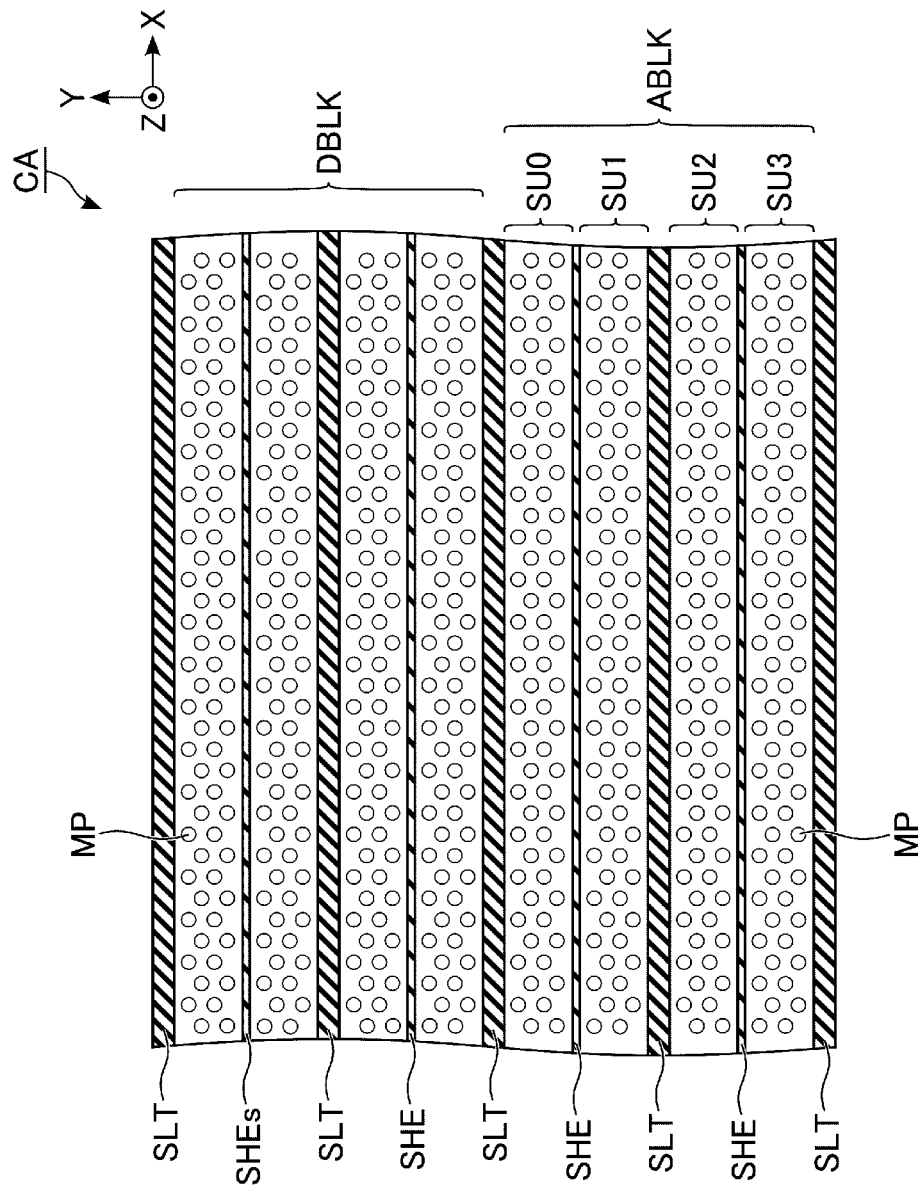
FIG. 5 illustrates a plan view of an example of a cell region of the memory cell array of the semiconductor memory according to the first embodiment.

FIG. 5 illustrates an example of a planar layout of the cell region CA of the memory cell array 10 of the semiconductor memory 1 according to the first embodiment by extracting one active block ABLK and one dummy block DBLK.

As illustrated in FIG. 5, in the cell region CA, the memory cell array 10 includes a plurality of memory pillars MP and a plurality of dummy memory pillars DMP. Specifically, in the active block ABLK, a plurality of memory pillars MP are disposed in a zigzag formation between the slits SLT and SHE. For example, the dummy memory pillars DMP are disposed to overlap the slit SHE.

The memory pillar MP functions as, for example, a single NAND string NS. The dummy memory pillar DMP is a structural body which has the same structure as, for example, that of the memory pillar MP but is not used to store data.

For example, in the active block ABLK, an aggregate of memory pillars MP provided between slits SLT and SHE that are adjacent to each other corresponds to a single string unit SU. In other words, in the active block ABLK, the string unit SU extends in the X direction. For example, the string units SU0 to SU3 are arranged side-by-side in the Y direction.

A plurality of memory pillars MP are disposed between slits SLT and SHEs that are adjacent to each other in the dummy block DBLK in the same manner as between the slits SLT and SHE. The rest of the planar layout of the dummy block DBLK in the cell region CA is the same as, for example, the planar layout of the active block ABLK, and thus a description thereof will be omitted.

Figure 6:
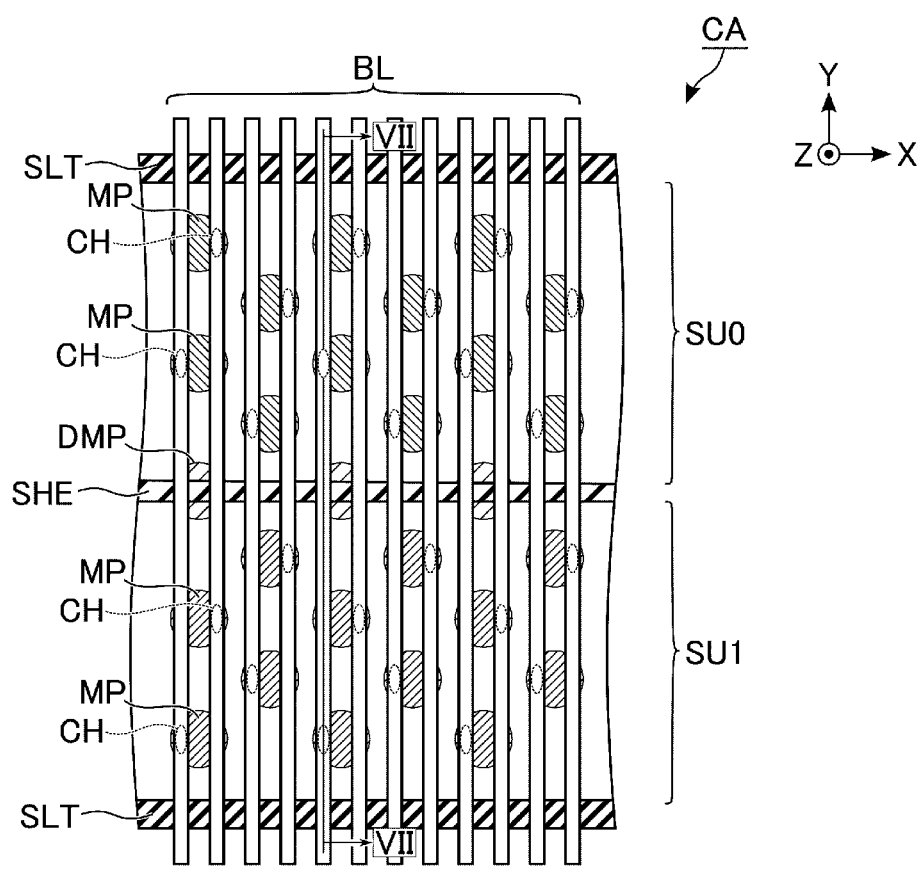
FIG. 6 illustrates another plan view of an example of the cell region of the memory cell array of the semiconductor memory according to the first embodiment.

FIG. 6 illustrates an example of a more detailed planar layout of the cell region CA of the memory cell array 10 of the semiconductor memory 1 according to the first embodiment by extracting string units SU0 and SU1 of the active block ABLK.

As illustrated in FIG. 6, a plurality of bit lines BL and a plurality of contacts CH are disposed in the memory cell array 10 in correspondence to the memory pillars MP described with reference to FIG. 5.

Specifically, each of the plurality of bit lines BL extends in the Y direction, and the plurality of bit lines BL are arranged side-by-side in the X direction. Each of the plurality of contacts CH are provided between a bit line BL and a memory pillar MP corresponding to the bit line BL.

For example, each memory pillar MP overlaps two bit lines BL. Each memory pillar MP is electrically connected to a single bit line BL among a plurality of overlapping bit lines BL, via the columnar contact CH.

The number of bit lines BL overlapping a memory pillar MP may be designed to be any number. Each memory pillar MP should be electrically connected to one among the plurality of overlapping bit lines BL, via the columnar contact CH.

Figure 7:
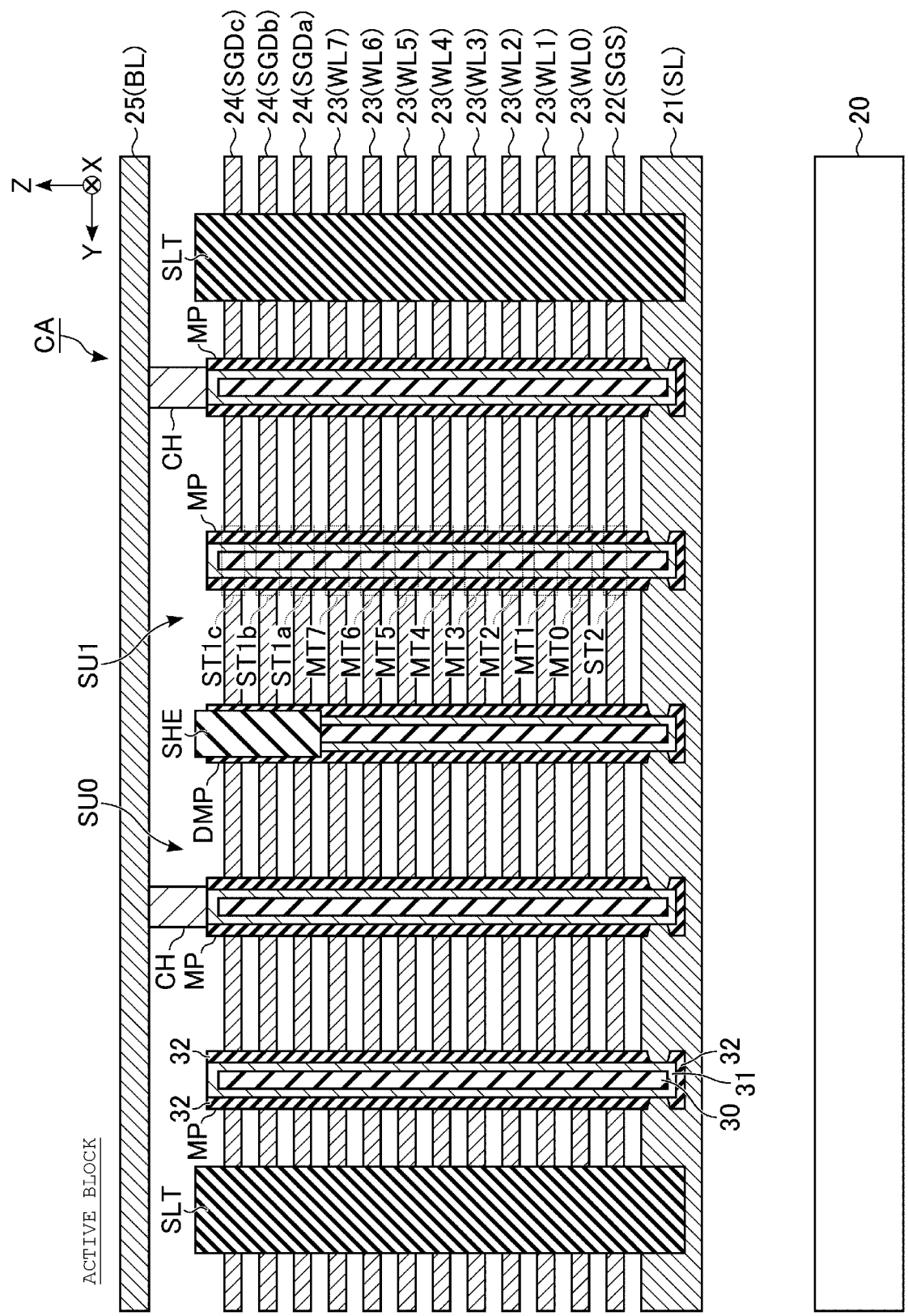
FIG. 7 illustrates a cross-sectional view of an example of the cell region of the memory cell array of the semiconductor memory according to the first embodiment.

FIG. 7 illustrates a cross-sectional view of the memory cell array 10 taken along the line VII-VII in FIG. 6, and illustrates an example of a cross-sectional structure of the memory cell array 10 in a region corresponding to the active block ABLK in the cell region CA.

As illustrated in FIG. 7, the region corresponding to the active block ABLK in the cell region CA includes, for example, conductors 21 to 25, the memory pillars MP, the dummy memory pillars DMP, the contacts CH, and the slits SLT and SHE.

The conductor 21 is provided on the semiconductor substrate 20 via an insulating layer. The conductor 21 is formed, for example, in a plate shape which spreads along an XY plane, and is used as the source line SL. The conductor 21 is, for example, poly-silicon (Si) doped with phosphor. For example, circuits (not illustrated) such as the row decoder module 15 or the sense amplifier module 16 are provided in a region between the semiconductor substrate 20 and the conductor 21, that is, under the memory cell array 10.

The conductor 22 is provided on the conductor 21 via an insulating layer. The conductor 22 is formed, for example, in a plate shape which spreads along the XY plane, and is used as the select gate line SGS. The conductor 22 is, for example, poly-silicon (Si) doped with phosphor.

Insulating layers and conductors 23 are alternately stacked on the conductor 22. A conductor 23 is formed, for example, in a plate shape which spreads along the XY plane. The plurality of stacked conductors 23 are respectively used as the word lines WL0 to WL7 in this order from the semiconductor substrate 20 side. The conductor 23 contains, for example, tungsten (W).

Insulating layers and conductors 24 are alternately stacked on the conductor 23. A conductor 24 is formed, for example, in a plate shape which spreads along the XY plane. The plurality of stacked conductors 24 are respectively used as the select gate lines SGDa to SGDc in this order from the semiconductor substrate 20 side. The conductor 24 contains, for example, tungsten (W).

The conductor 25 is provided on the conductor 24 via an insulating layer. The conductor 25 is formed, for example, in a linear shape extending in the Y direction, and is used as the bit line BL. In other words, a plurality of conductors 25 are arranged side-by-side in the X direction in a region (not illustrated). A conductor 25 contains, for example, copper (Cu).

The memory pillar MP is formed in a columnar shape extending in the Z direction, and penetrates through, for example, the conductors 22 to 24. Specifically, for example, the upper end of the memory pillar MP is placed in the layer between the layer in which a conductor 24 is provided and the layer in which the conductor 25 is provided. The lower end of the memory pillar MP is placed in, for example, the layer in which the conductor 21 is provided. In other words, the lower end of the memory pillar MP is in contact with the conductor 21 instead of penetrating through the conductor 21.

The memory pillar MP includes, for example, a core member 30, a conductor 31, and a stacked film 32. The core member 30 is formed in a columnar shape extending in the Z direction. For example, the upper end of the core member 30 is placed in the layer between the layer in which the uppermost conductor 24 is provided and the upper end of the memory pillar MP. The lower end of the core member 30 is placed in, for example, the layer in which the conductor 21 is provided. The core member 30 contains an insulator such as silicon dioxide ($SiO_2$).

The core member 30 is covered with the conductor 31. The conductor 31 has a portion in contact with the conductor 21 in the layer in which the conductor 21 is provided, and is electrically connected to the conductor 21. The conductor 31 is, for example, poly-silicon (Si). The side surface and lower surface of the conductor 31 are covered with the stacked film 32 except for a portion thereof where the conductors 21 and 31 are in contact with each other.

Figure 8:
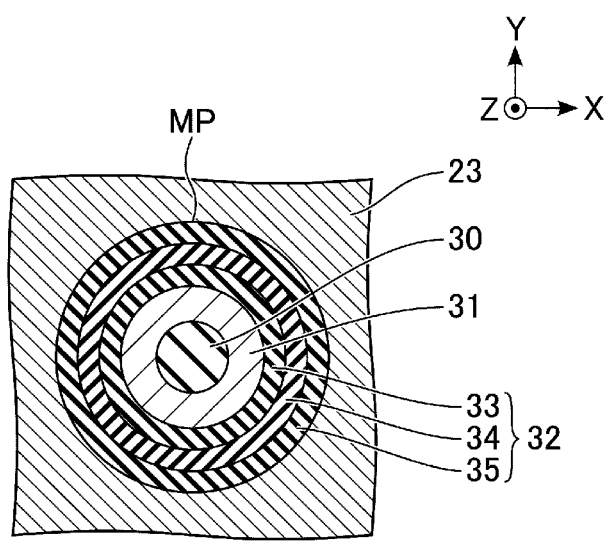
FIG. 8 illustrates a cross-sectional view of an example of a memory pillar in the semiconductor memory according to the first embodiment.

FIG. 8 illustrates an example of a cross-sectional structure of the memory pillar MP in parallel to a surface of the semiconductor substrate 20, including the conductor 23 used as the word line WL.

As illustrated in FIG. 8, the core member 30 is provided at the center of the memory pillar MP in the layer including the conductor 23. The conductor 31 covers the side surface of the core member 30. The stacked film 32 covers the side surface of the conductor 31. The stacked film 32 includes, for example, a tunnel oxide film 33, an insulating film 34, and a block insulating film 35.

The tunnel oxide film 33 covers the side surface of the conductor 31. The insulating film 34 covers a side surface of the tunnel oxide film 33. The block insulating film 35 covers a side surface of the insulating film 34. The conductor 23 covers a side surface of the block insulating film 35.

Referring to FIG. 7 again, the columnar contact CH is provided on the upper surface of the memory pillar MP, that is, on the conductor 31. The upper surface of the contact CH is in contact with a single conductor 25, that is, a single bit line BL.

The dummy memory pillar DMP is formed in a columnar shape extending in the Z direction, and penetrates through, for example, the conductors 22 to 24. The configuration of the dummy memory pillars DMP is the same as, for example, the configuration of the memory pillar MP, and thus a description thereof will be omitted.

The slit SLT is formed in a plate shape spreading along an XZ plane, and separates, for example, the conductors 22 to 24. Specifically, an upper end of the slit SLT is placed in, for example, the layer between the layer including the upper end of the memory pillar MP and the layer in which the conductor 25 is provided. A lower end of the slit SLT is placed in, for example, the layer in which the conductor 21 is provided. In other words, for example, the lower end of the slit SLT is in contact with the conductor 21 instead of penetrating through the conductor 21. The slit SLT contains an insulator such as silicon dioxide ($SiO_2$).

The slit SHE is formed in a plate shape spreading along the XZ plane, and separates, for example, the conductor 24 and a part of the dummy memory pillars DMP. Specifically, the upper end of the slit SHE is placed in, for example, the layer between the layer including the upper end of the memory pillar MP and the layer in which the conductor 25 is provided. The lower end of the slit SHE is placed, for example, between the layer in which the uppermost conductor 23 is provided and the layer in which the lowermost conductor 24 is provided. The slit SHE should separate at least all of the conductors 24 provided in the region. The slit SHE contains an insulator such as silicon dioxide ($SiO_2$).

In the above-described configuration of the memory pillar MP, for example, a portion where the memory pillar MP intersects the conductor 22 functions as the select transistor ST2. Respective portions where the memory pillar MP intersects the plurality of conductors 23 function as the memory cell transistors MT0 to MT7. Respective portions where the memory pillar MP intersects the plurality of conductors 24 function as the select transistors ST1a to ST1c.

In other words, the conductor 31 in the memory pillar MP functions as a channel of the memory cell transistor MT, and the select transistors ST1 and ST2. The insulating film 34 functions as a charge storage layer of the memory cell transistor MT.

Figure 9:
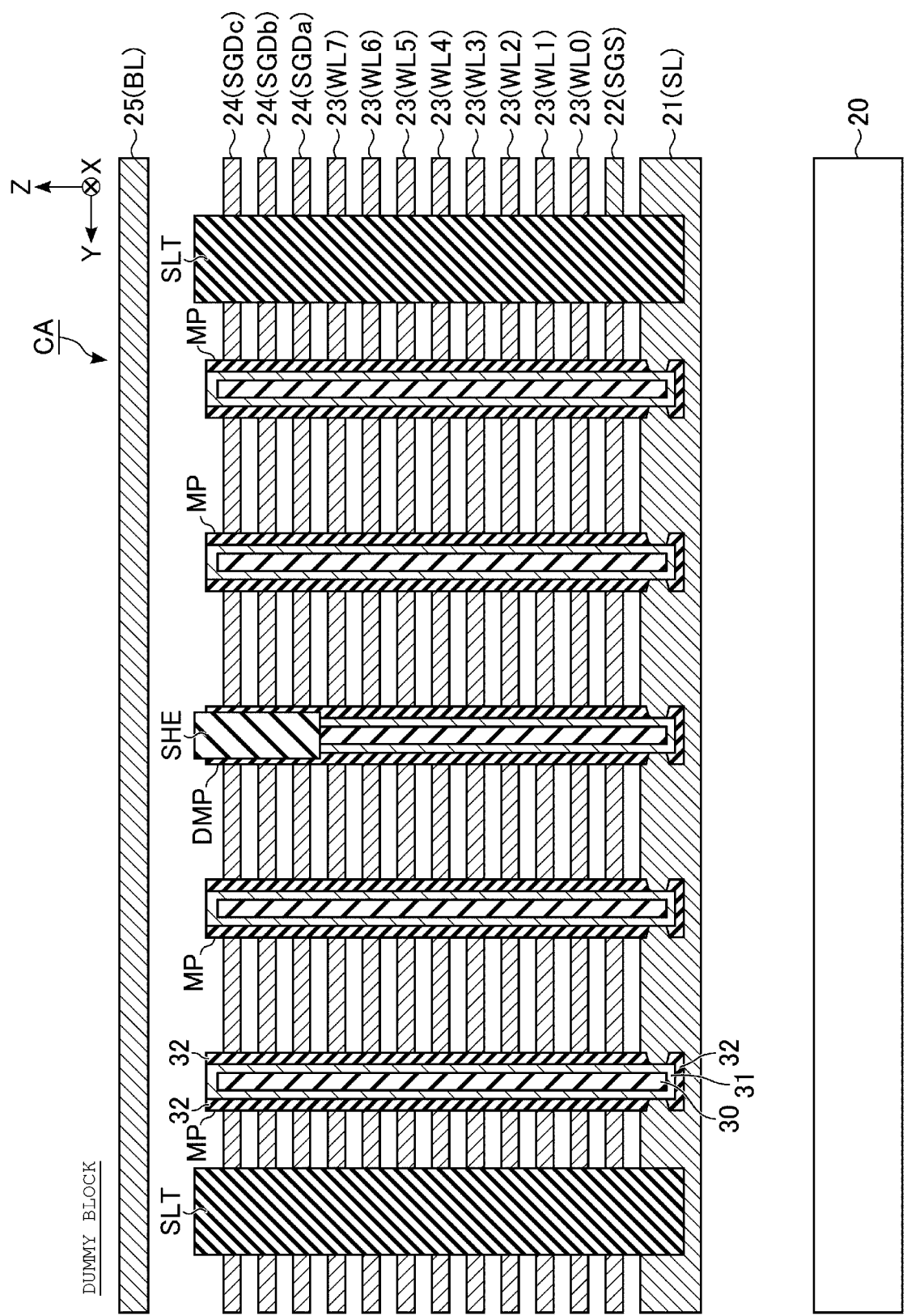
FIG. 9 illustrates a cross-sectional view of an example of the cell region of the memory cell array of the semiconductor memory according to the first embodiment.

FIG. 9 illustrates an example of a cross-sectional structure of the memory cell array 10 in a region corresponding to the dummy block DBLK in the cell region CA.

As illustrated in FIG. 9, the region corresponding to the dummy block DBLK in the cell region CA includes, for example, the conductors 21 to 25, the memory pillars MP, the dummy memory pillars DMP, and the slits SLT and SHE. A structure of the slit SHEs (not illustrated) in the cell region CA is the same as the structure of the slit SHE. The structure of the dummy block DBLK is the same, for example, as a structure of the active block ABLK from which the contact CH is omitted.

For example, a preferred example of the structure of dummy block DBLK in the cell region CA is that of the active block ABLK which does not include the contact CH, but the structure may include the contact CH. In other words, in the dummy block DBLK, the memory pillar MP may or not be electrically connected to the conductor 25.

In the active block ABLK, the memory pillar MP may be electrically connected to the conductor 25 via two or more contacts, and may be electrically connected thereto via other wirings. In this case, in the dummy block DBLK, the same contact and wiring as those in the active block ABLK may be formed between the memory pillar MP and the conductor 25, and a structure in which some of the contacts and the wirings provided in the active block ABLK are omitted may be formed. The memory pillar MP may be provided in the dummy block DBLK in the same as in the active block ABLK, but needs not be provided.

Structure of Memory Cell Array 10 in Lead Region HA

Figure 10:
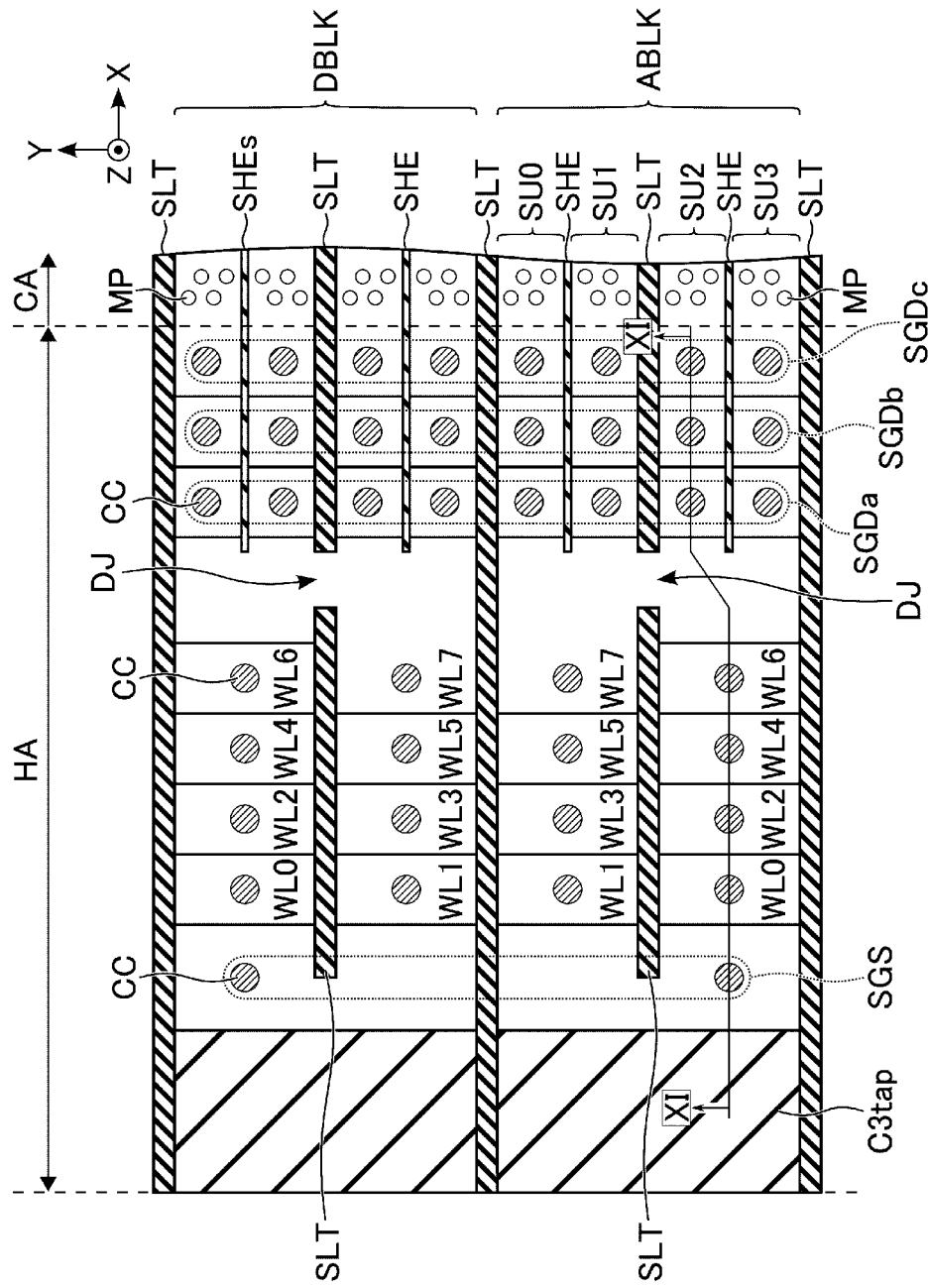
FIG. 10 illustrates a plan view of an example of a lead region of the memory cell array of the semiconductor memory according to the first embodiment.

FIG. 10 illustrates an example of a planar layout of the lead region HA of the memory cell array 10 of the semiconductor memory 1 according to the first embodiment by extracting one active block ABLK and one dummy block DBLK.

As illustrated in FIG. 10, in the region of the active block ABLK in the lead region HA, a plurality of conductors respectively corresponding to the select gate line SGS, the word lines WL0 to WL7, and the select gate line SGD have portions (terrace portions) not overlapping overlying conductors.

For example, a plurality of conductors 24 respectively corresponding to the select gate lines SGDa, SGDb, and SGDc are provided in a stepped form in which a step difference is formed in the X direction. In the lead region HA, the horizontal-direction slit SLT in the active block ABLK separates the select gate lines SGDa, SGDb, and SGDc. The slit SHE similarly separates the select gate lines SGDa, SGDb, and SGDc.

In this example, in the active block ABLK, each of the select gate lines SGDa, SGDb, and SGDc is separated into four lines by the slits SLT and SHE. The select gate lines SGD separated into four (that is, a set of SGDa, SGDb, and SGDc) respectively correspond to the string units SU0 to SU3.

For example, a plurality of conductors 23 respectively corresponding to the word lines WL0 to WL7 have a step difference of one step in the Y direction and are provided in a stepped shape of two rows in which a step difference is formed in the X direction. The slit gap DJ provided in the horizontal-direction slit in the active block ABLK is disposed in, for example, the terrace portion of the word line WL7. The word lines WL provided in the same layer in the same active block ABLK are short-circuited to each other via the slit gap DJ.

The conductor 22 corresponding to the select gate line SGS is led in the X direction from, for example, end part regions of the word lines WL0 and WL1. The horizontal-direction slit SLT in the active block ABLK may or may not separate the select gate line SGS.

In the active block ABLK, for example, contacts CC are provided in the terrace portions of the select gate line SGS, the word lines WL0 to WL7, and the select gate lines SGDa, SGDb, and SGDc.

For example, a C3 connection region C3tap is provided in an end part region in the X direction within the region between the two horizontal-direction slits SLT in contact with the active block ABLK. The C3 connection region C3tap is a region in which a contact (not illustrated) for connecting a wiring provided on the memory cell array 10 to a wiring provided under the memory cell array 10 is provided.

Each of the select gate line SGS, the word lines WL0 to WL7, and the select gate line SGD is electrically connected to the row decoder module 15 provided under the memory cell array 10 via a contact penetrating through the corresponding contact CC and the C3 connection region C3tap.

The C3 connection region C3tap may be provided outside the region interposed between the horizontal-direction slits SLT. Further, in the lead region HA, the horizontal-direction slit SLT provided between the blocks BLK adjacent to each other should separate at least the conductor 22 corresponding to the select gate line SGS. Thus, depending on the layout of the memory cell array 10 it may be impossible to interpose the C3 connection region C3*tap* between the horizontal-direction slits SLT.

In the lead region HA, the slit SHEs in the dummy block DBLK separates the select gate lines SGDa, SGDb, and SGDc in the same manner as the slit SHE. The rest of the planar layout of the dummy block DBLK in the lead region HA is for example the same as the planar layout obtained by inverting the planar layout of the active block ABLK adjacent thereto, and thus a description thereof will be omitted.

Figure 11:
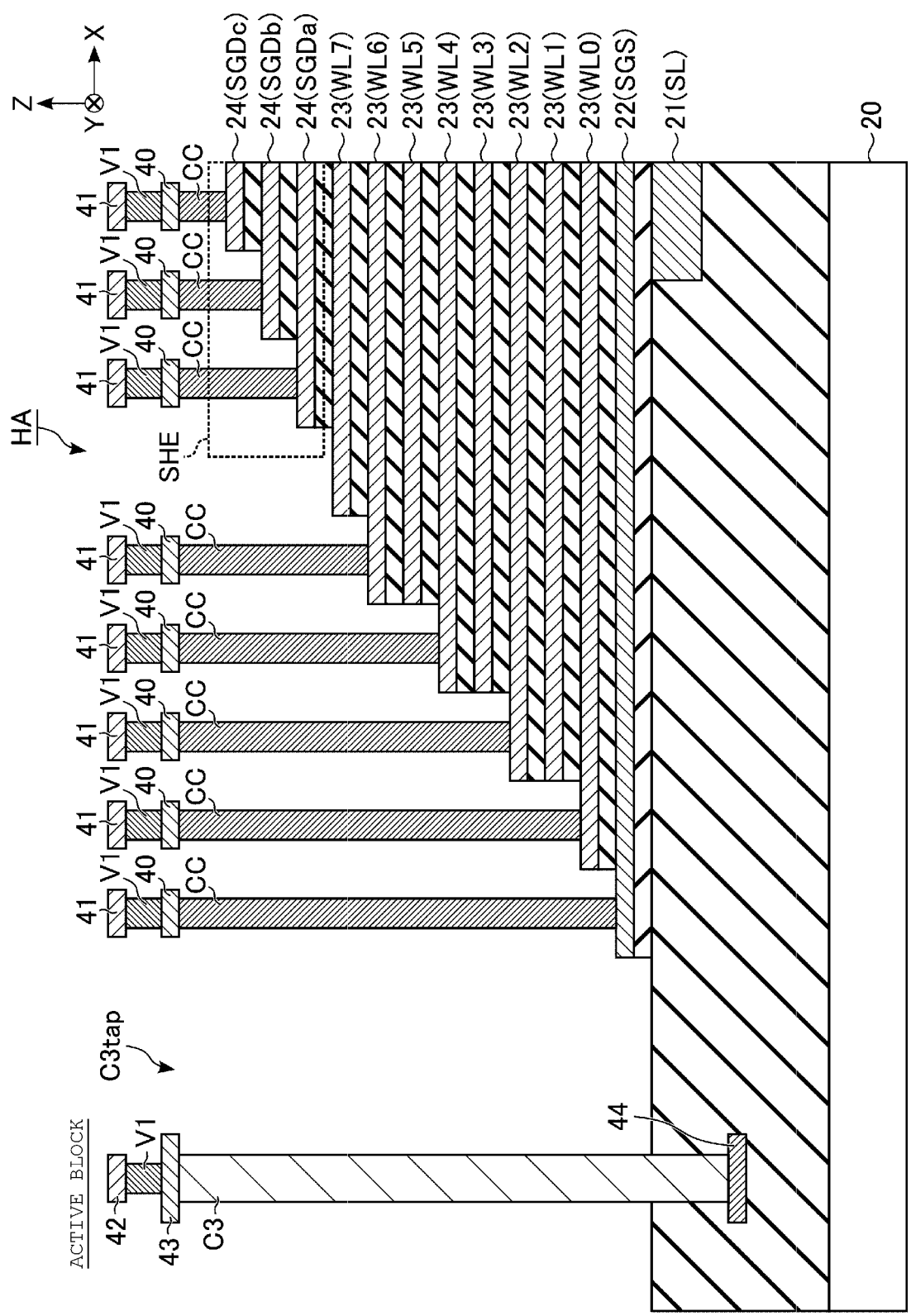
FIG. 11 illustrates a cross-sectional view of an example of the lead region of the memory cell array of the semiconductor memory according to the first embodiment.

FIG. 11 illustrates a cross-sectional view taken along the line IX-IX in FIG. 10, and illustrates an example of a cross-sectional structure of the memory cell array 10 in the region corresponding to the active block ABLK in the lead region HA.

As illustrated in FIG. 11, the region corresponding to the active block ABLK in the lead region HA includes, for example, the conductors 21 to 24, conductors 40 to 44, and contacts CC, V1, and C3.

The end part of each of the conductor 22, the conductor 23, and the conductor 24 respectively corresponding to the select gate line SGS, the word lines WL, and the select gate lines SGD is provided in a stepped form as described above. In other words, in the lead region HA, each end part of the conductors 22 to 24 has at least a portion not overlapped by the overlying conductor 23 or conductor 24. The end part of the conductor 21 need not extend to the outside of the conductor 22 in the lead region HA.

Each contact CC is formed in a columnar shape extending in the Z direction. The contact CC includes, for example, a conductor formed in a columnar shape. A spacer may be provided on the side surface of the columnar conductor provided in the contact CC. The conductor in the contact CC contains, for example, tungsten (W), and the spacer contains, for example, silicon dioxide (SiO$_2$).

The respective conductors 40 to 44 are wirings connecting the conductors 22 to 24 extended to the lead region HA from the cell region CA to the row decoder module 15. A plurality of conductors 40 are respectively provided on a plurality of contacts CC. A plurality of contacts V1 are respectively provided on the plurality of conductors 40. A plurality of conductors 41 are respectively provided on the plurality of contacts V1.

The conductor 41 is electrically connected to, for example, the corresponding conductor 42. The conductor 42 is electrically connected to the conductor 43 that is provided in the same layer as the conductor 40 and is in the C3 connection region C3*tap*, via, for example, the contact V1. The conductor is electrically connected to the conductor 44 that is provided in a layer lower than the conductor 21 and is in the C3 connection region C3*tap*, via, for example, the contact C3. The conductor 44 is electrically connected to the row decoder module 15 via a contact and a wiring (not illustrated).

The conductors 40 and 43 may be formed in the same layer, or may be formed in different layers. The conductors 41 and may be formed in the same layer, or may be formed in different layers. The corresponding conductors 40 and 41 may be connected to each other via a plurality of contacts, and a plurality of contacts may be connected to each other by different wirings.

In FIG. 11, the position of the slit SHE, extending in the depth direction of this cross-sectional view, is illustrated by the dashed line. As illustrated in FIG. 11, the slit SHE in the active block ABLK is provided to separate the plurality of conductors 24 respectively corresponding to the select gate lines SGDa, SGDb, and SGDc in the lead region HA.

Figure 12:
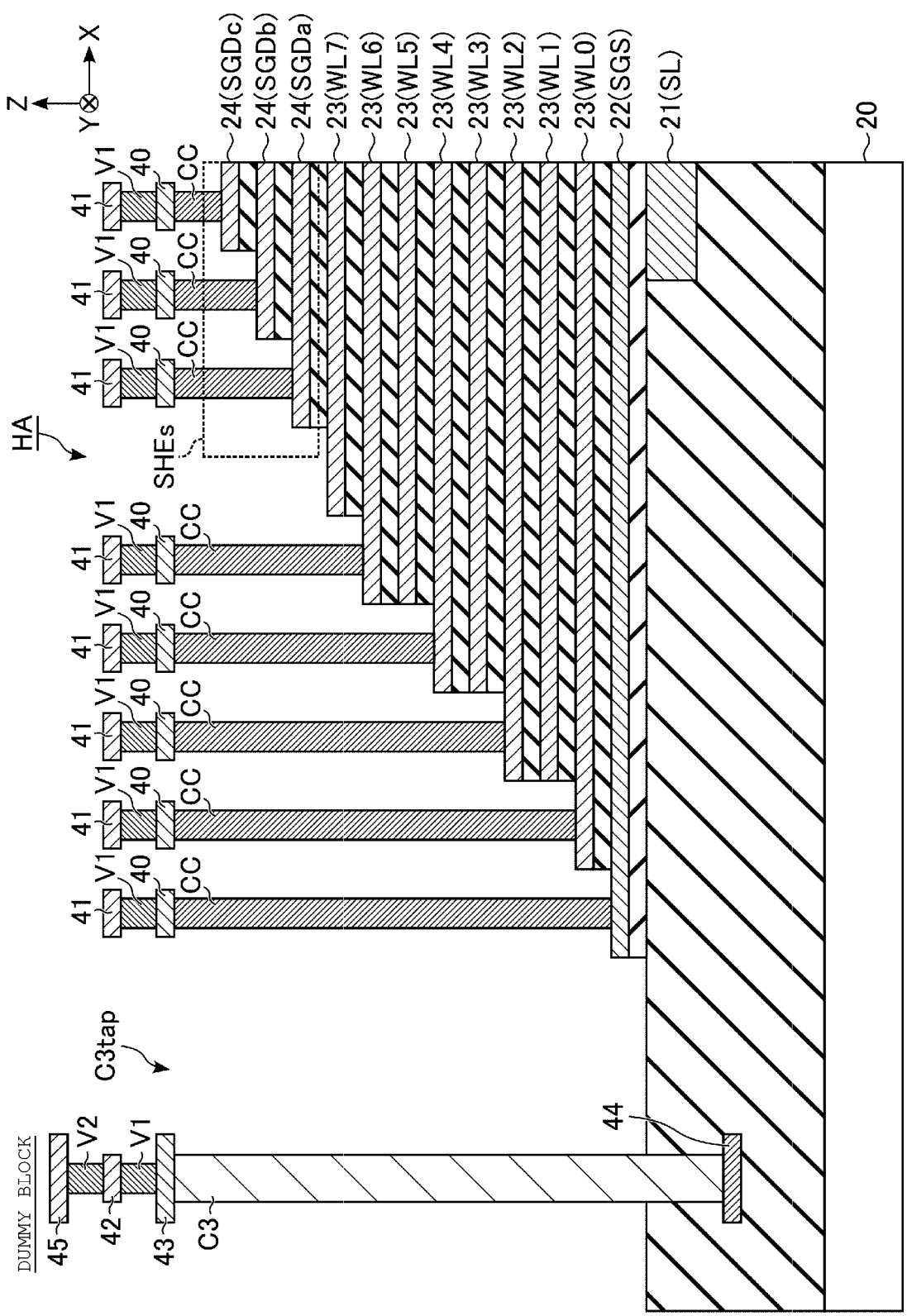
FIG. 12 illustrates a cross-sectional view of an example of the lead region of the memory cell array of the semiconductor memory according to the first embodiment.

FIG. 12 illustrates an example of a cross-sectional structure of the memory cell array 10 in the region corresponding to the dummy block DBLK in the lead region HA.

As illustrated in FIG. 12, the region corresponding to the dummy block DBLK in the lead region HA includes, for example, the conductors 21 to 24, the conductors 40 to 45, and the contacts CC, V1, V2, and C3.

The conductor 45 is used as, for example, a micro-pad. The micro-pad is a pad used in, for example, an inspection process. The conductor 45 is electrically connected to the corresponding conductor 42 via the contact V2. In other words, various wirings laid out in the dummy block DBLK are electrically connected to, for example, the micro-pad.

In FIG. 12, the position of the slit SHEs, extending in the depth direction of this cross-sectional view, is illustrated by a dashed line. As illustrated in FIG. 12, in the lead region HA, the slit SHEs in the dummy block DBLK is provided to separate the plurality of conductors 24 respectively corresponding to the select gate lines SGDa, SGDb, and SGDc.

The rest of the structure of the dummy block DBLK in the lead region HA is the same as, for example, the structure of the active block ABLK in the lead region HA, and thus a description thereof will be omitted.

The conductors 45 and 42 may be connected to each other via position contacts and wirings. The conductor 45 may be exposed at a chip surface of the semiconductor memory 1. The various wirings laid out in the dummy block DBLK may or not be connected to circuits provided in the layer below the conductor 21. In other words, in the dummy block DBLK, the conductors 43 and 44, and the contact C3 may be omitted.

In the above description, a description has been made of an exemplary case where the word lines WL of the active block ABLK are connected to the row decoder module 15 under the memory cell array 10 via the C3 connection region C3*tap*, but the structure is not limited to this. For example, the contact CC connected to the end part of the conductor 23 (word line WL) may be electrically connected to the row decoder module 15 under the memory cell array 10 via a contact which penetrates through stacked wirings (for example, a plurality of conductors 23) in the dummy block DBLK in the lead region HA.

The contact CC connected to the end part of the conductor 23 may be electrically connected to the row decoder module 15 under the memory cell array 10 via a contact which penetrates through stacked wirings (for example, a plurality of conductors 23) of the active block ABLK in the lead region HA. In a case where the horizontal-direction slit SLT is provided at the other end part of the block group BLKG in the X direction, the C3 connection region C3*tap* may be provided outside the region surrounded by the vertical-direction slit and the horizontal-direction slits.

Structure of Memory Cell Array 10 in Vicinity of Plane Separation Region PNdiv

Figure 13:
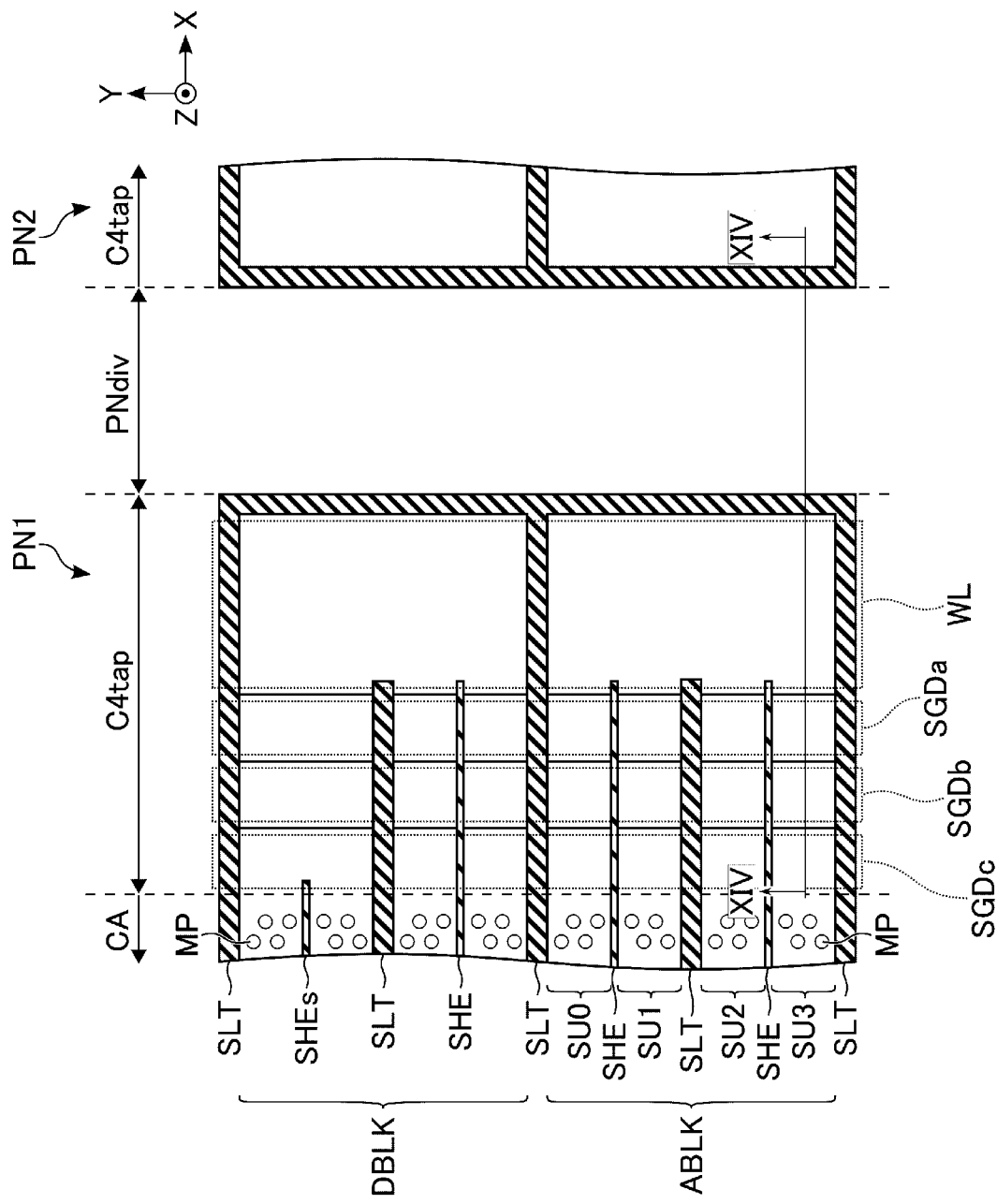
FIG. 13 illustrates a plan view of an example of the vicinity of a plane separation region of the semiconductor memory according to the first embodiment.

FIG. 13 illustrates an example of a planar layout of the vicinity of the plane separation region PNdiv of the semiconductor memory 1 according to the first embodiment by extracting one active block ABLK and one dummy block DBLK. In the following, the C4 connection region C4*tap* of the plane PN1 will be focused on.

As illustrated in FIG. 13, in the C4 connection region C4*tap*, a plurality of conductors 24 respectively corresponding to the select gate lines SGDa, SGDb, and SGDc, and the conductor 23 corresponding to the uppermost word line WL have portions (terrace portions) not overlapped by overlying conductors.

For example, in the active block ABLK, the plurality of conductors 24 respectively corresponding to the select gate lines SGDa, SGDb, and SGDc are provided in a stepped form in which a step difference is formed in the X direction. In the C4 connection region C4*tap*, the horizontal-direction slit SLT in the active block ABLK separates the select gate lines SGDa, SGDb, and SGDc. Similarly, the slit SHE separates the select gate lines SGDa, SGDb, and SGDc.

The horizontal-direction slit SLT disposed in the active block ABLK is not in contact with the vertical-direction slit SLT. In other words, the word lines WL provided in the same layer in the C4 connection region C4*tap* are short-circuited to each other in the string units SU0 to SU3.

In the dummy block DBLK, the end part of the slit SHEs does not extend to the stepped portions of the select gate lines SGDa, SGDb, and SGDc. In other words, in the C4 connection region C4*tap*, the slit SHEs does not separate the string units SU adjacent to each other and the select gate lines SGDa, SGDb, and SGDc provided in the same layer. In other words, in the string units SU adjacent to each other via the slit SHEs in the dummy block DBLK, the select gate lines SGD provided in the same layer are short-circuited to each other in the C4 connection region C4*tap*.

The rest of the planar layout of the dummy block DBLK in the C4 connection region C4*tap* is the same as a planar layout obtained by inverting the planar layout of the active block ABLK adjacent thereto, and thus a description thereof will be omitted.

Figure 14:
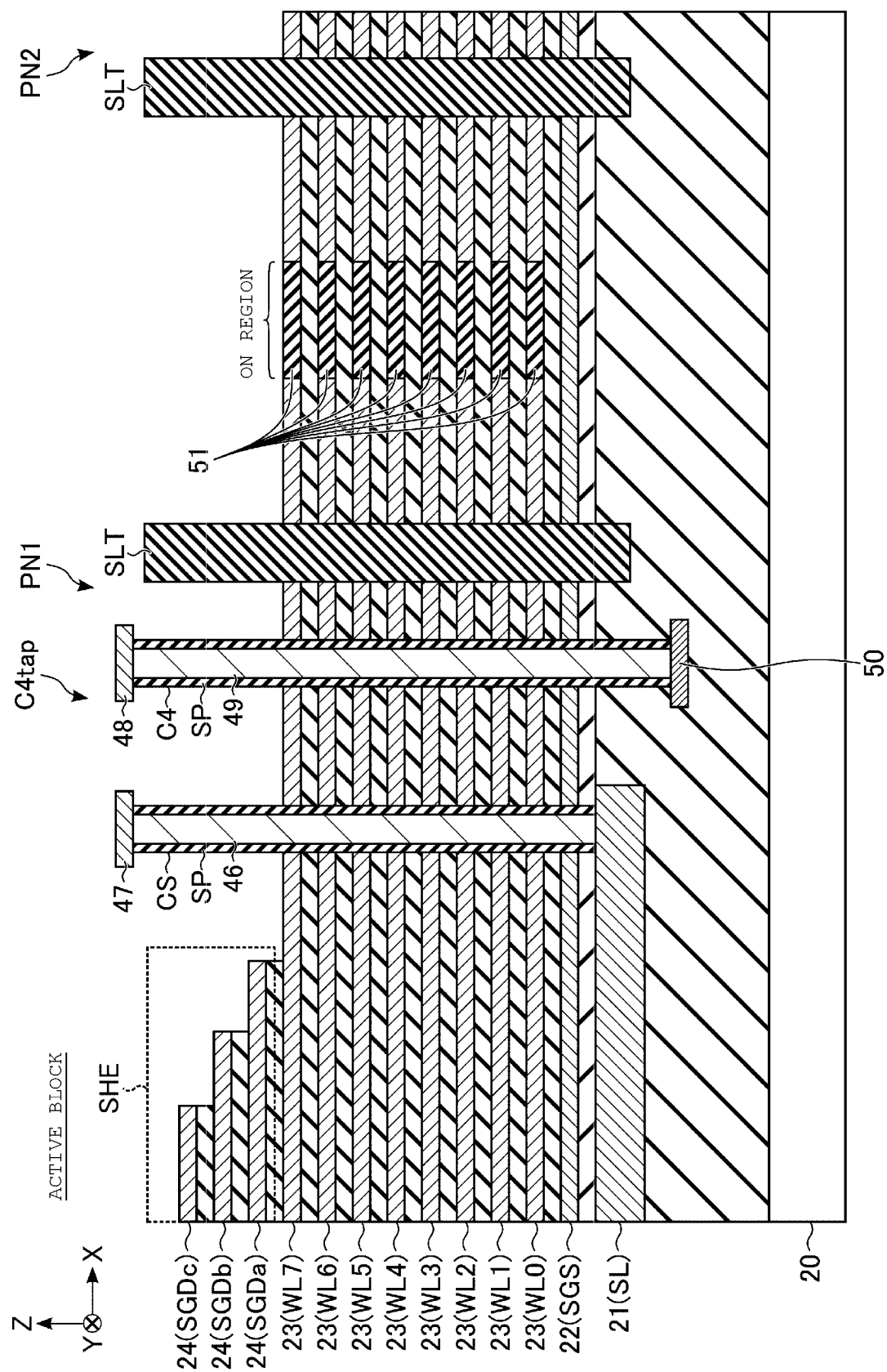
FIG. 14 illustrates a plan view of an example of the vicinity of the plane separation region of the semiconductor memory according to the first embodiment.

FIG. 14 is a cross-sectional view taken along the line XIV-XIV in FIG. 13, and illustrates an example of a cross-sectional structure of the memory cell array 10 including a region corresponding to the active block ABLK in the vicinity of the plane separation region PNdiv.

First, the C4 connection region C4*tap* of the plane PN1 will be focused on.

As illustrated in FIG. 14, the region corresponding to the active block ABLK in the C4 connection region C4*tap* includes, for example, the conductors 21 to 24, conductors 47, 48, and 50, and contacts CS and C4.

The end part of the conductor 21 in the plane PN1 extends, for example, from the cell region CA to the middle of the C4 connection region C4*tap*. Each of the conductors 22 and 23 are separated by the vertical-direction slit SLT, and is in contact with the vertical-direction slit SLT. A plurality of conductors 24 respectively corresponding to the select gate lines SGDa, SGDb, and SGDc are provided, for example, in a stepped form in the same manner as in the lead region HA. This is only an example, and, in the C4 connection region C4*tap*, the plurality of conductors 24 respectively corresponding to the select gate lines SGDa, SGDb, and SGDc need not be provided in a stepped form.

In the C4 connection region C4*tap*, the columnar contact CS is provided on the conductor 21, and the contact CS includes a conductor 46 and a spacer SP. The conductor 46 is provided in a columnar shape, and a lower end thereof is in contact with the conductor 21. The spacer SP is provided on the side surface of the conductor 46.

The conductor 47 is provided on the contact CS, that is, on the conductor 46. The conductor 47 is electrically connected to, for example, the conductor 48 provided in the same layer in the C4 connection region C4*tap*.

The conductor 48 is electrically connected to the conductor 50 provided in a layer below the conductor 21 via the contact C4. The contact C4 includes a conductor 49 and a spacer SP. The conductor 49 is provided in a columnar shape, and has a lower end in contact with the conductor 50 and an upper end in contact with the conductor 48. The spacer SP is provided on the side surface of the conductor 49. The conductor 50 is electrically connected to a circuit provided under the memory cell array 10.

While FIG. 14 illustrates a set of the contacts CS and C4, the C4 connection region C4*tap* may include a plurality of contacts CS and C4, and may include a plurality of conductors 47, 48, and 50. In this case, the conductor 21 is electrically connected to the corresponding conductor 50 via a combination of the contacts CS and C4 and the conductors 47 and 48.

In the region (plane separation region PNdiv) between the vertical-direction slit corresponding to the plane PN1 and the vertical-direction slit corresponding to the plane PN2, a wiring layer in which the conductor 23 is provided includes a region (for example, an ON region) in which insulators 51 are provided. The insulators 51 are provided in a portion separated from the slit SLT. Each of the insulators 51 contains, for example, silicon nitride (SiN).

In FIG. 14, the position of the slit SHE extending in the depth direction of this cross-sectional view is illustrated by the dashed line. As illustrated in FIG. 14, the slit SHE in the active block ABLK is provided to separate the plurality of conductors 24 corresponding to the select gate lines SGDa, SGDb, and SGDc in the C4 connection region C4*tap*.

Figure 15:
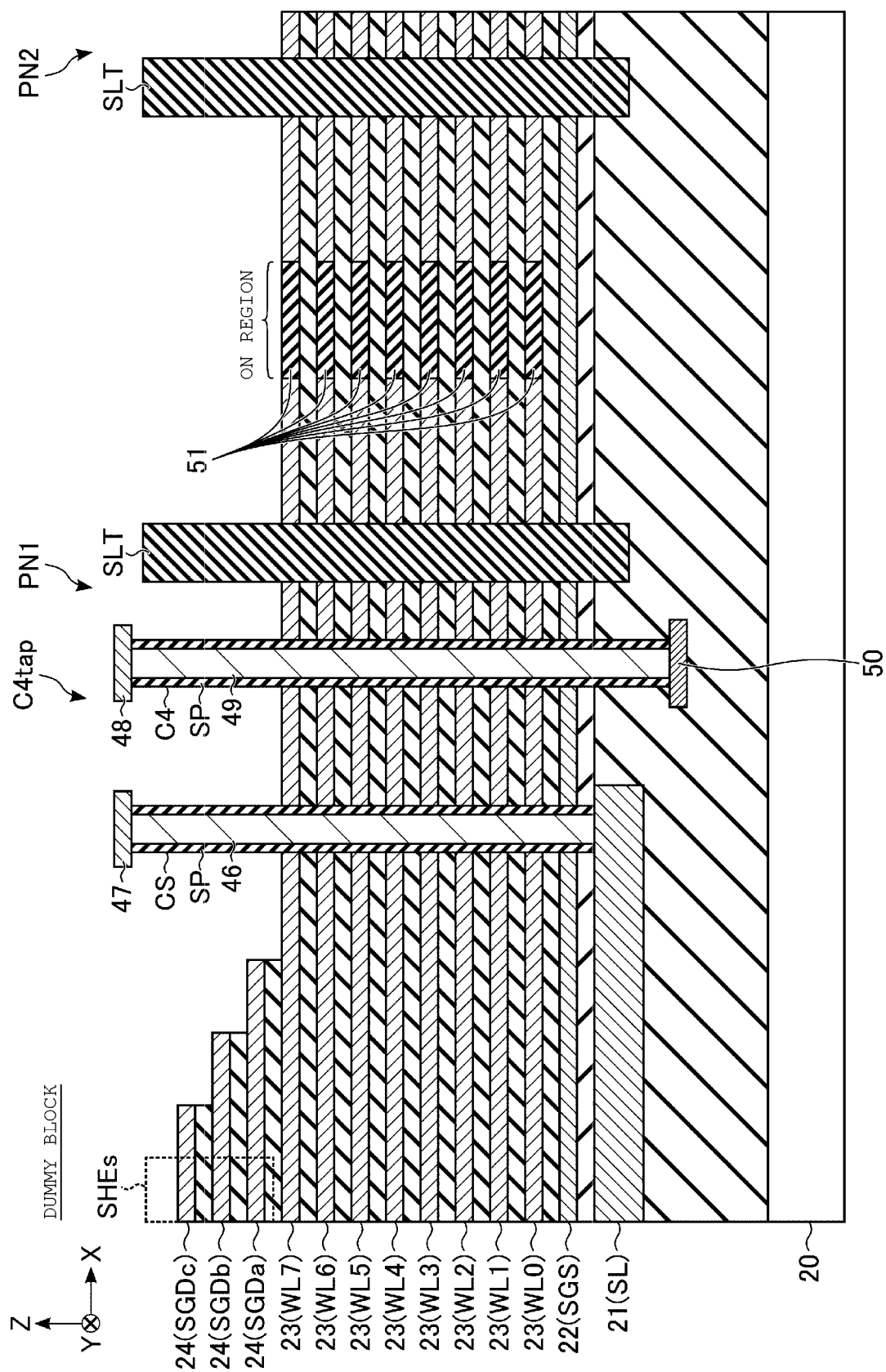
FIG. 15 illustrates a plan view of an example of the vicinity of the plane separation region of the semiconductor memory according to the first embodiment.

FIG. 15 illustrates an example of a cross-sectional structure of the memory cell array 10 in the region corresponding to the dummy block DBLK in the C4 connection region C4*tap*. In FIG. 15, the position of the slit SHEs extending in the depth direction of this cross-sectional view is illustrated by the dashed line.

As illustrated in FIG. 15, the slit SHEs in the dummy block DBLK does not separate the plurality of conductors 24 respectively corresponding to the select gate lines SGDa, SGDb, and SGDc in the C4 connection region C4*tap*. The rest of the structure of the dummy block DBLK in the C4 connection region C4*tap* is the same as, for example, the structure of the active block ABLK in the C4 connection region C4*tap*, and thus a description thereof will be omitted.

In the above description, the structure of the memory cell array 10A corresponding to the plane PN1 has been described, and the structure of the plane PN2 is the same as a structure obtained by inverting, for example, the structure of the plane PN1 about the axis in the Y direction, and thus a description thereof will be omitted.

In the structure of the memory cell array 10 described above, the number of conductors 23 is designed based on the number of word lines WL. A plurality of conductors 22 provided in a plurality of layers may be allocated to the select gate lines SGS. In a case where the select gate lines SGS are provided in a plurality of layers, a conductor which is different from the conductor 22 may be used.

1-2. Effect of First Embodiment

According to the semiconductor memory 1 of the first embodiment described above, it is possible to estimate a resistance value of the select gate line SGD. In the following, details of the effect will be described.

Figure 16:
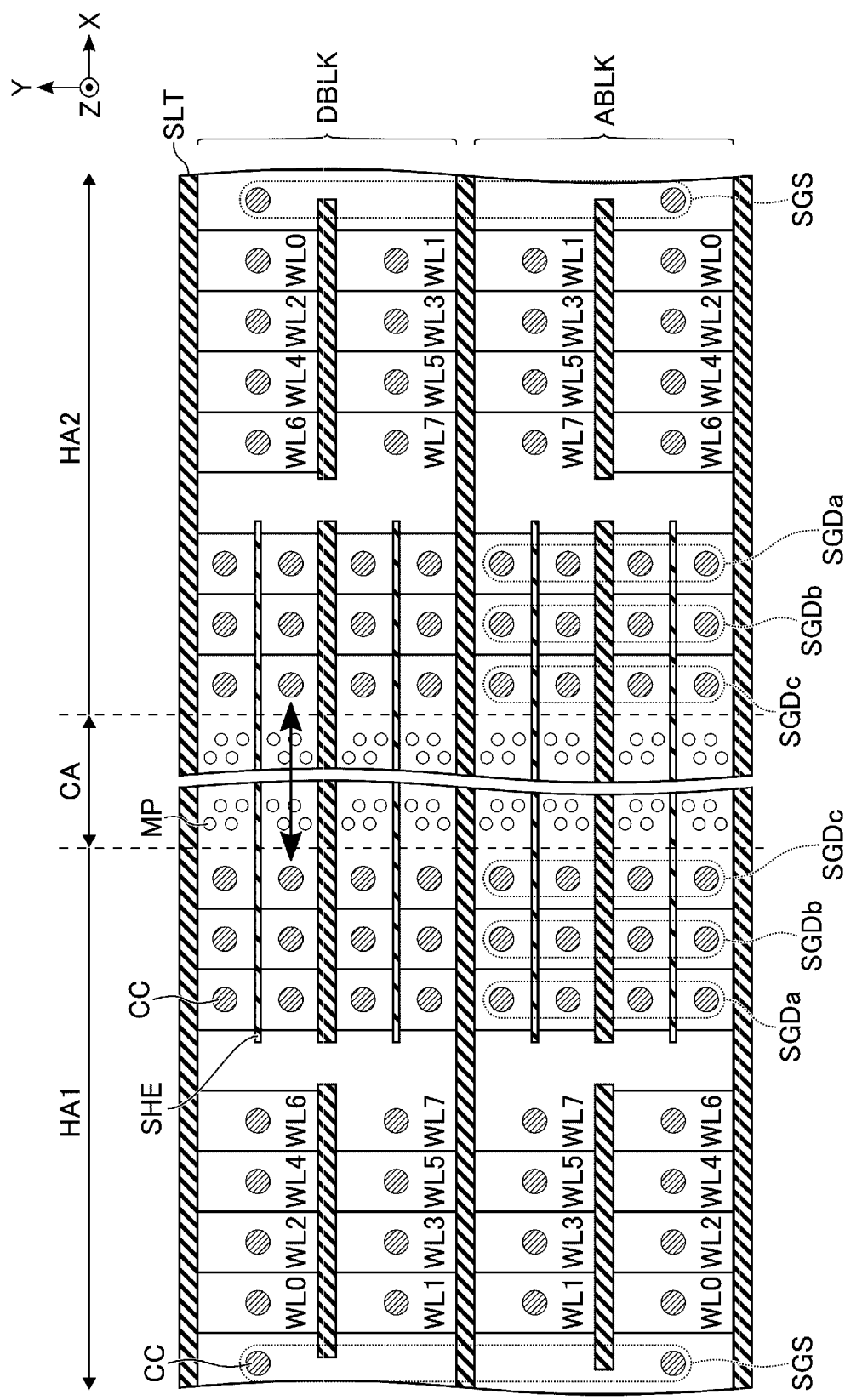
FIG. 16 illustrates a plan view of an example of a memory cell array in a comparative example of the first embodiment.

FIG. 16 illustrates an example of a planar layout of a memory cell array (plane) in a comparative example of the first embodiment.

As illustrated in FIG. 16, lead regions are provided on both sides in the X direction in the memory cell array of the comparative example. Specifically, a lead region HA1 and a lead region HA2 are respectively disposed on one side and the other side in the X direction, and the cell region CA is disposed between the lead region HA1 and the lead region HA2.

For example, the planar layout of the lead region HA1 of the comparative example is the same as the planar layout of the lead region HA of the first embodiment. The planar layout of the lead region HA2 of the comparative example is the same as a planar layout obtained by inverting the planar layout of the lead region HA of the first embodiment about the axis in the Y direction.

As described above, in a case where the lead regions HA are disposed with the cell region CA interposed therebetween, for example, the contacts CC of each of the lead region HA1 and the lead region HA2 are connected to various wirings led from the cell region CA.

In the comparative example, voltages may be applied from both sides in the X direction to the select gate lines SGD and SGS and the word lines WL, or from one side in the X direction. In other words, in the comparative example, of two contacts CC connected to one side and the other side of each wiring in the X direction, only one contact CC may be connected to the row decoder module, or both of the contacts CC may be connected to the row decoder module.

In contrast, the semiconductor memory 1 according to the first embodiment has a structure in which the two planes PN1 and PN2 (that is, the memory cell arrays 10A and 10B) are adjacent to each other in the X direction. In the planes PN1 and PN2, the C4 connection region C4*tap* is provided in the portion in contact with the plane separation region PNdiv between the two planes PN1 and PN2.

As described above, in the semiconductor memory 1 according to the first embodiment, the lead region HA of each of the planes PN1 and PN2 is provided on only one side in the X direction, unlike the comparative example.

As a result, in the semiconductor memory 1 according to the first embodiment, it is possible to reduce the area occupied by the lead region HA compared with a case where two planes in which the lead regions HA with a stepped structure are adjacent to each other on both sides in the X direction as in the comparative example. Therefore, the semiconductor memory 1 according to the first embodiment can prevent an increase of a chip area of the semiconductor memory 1 having a plurality of planes.

In the dummy block DBLK in the comparative example illustrated in FIG. 16, it is possible to easily measure the resistance value of a corresponding wiring by using a micro-pad connected to the contact CC provided in the lead region HA1 and a micro-pad connected to the contact CC provided in the lead region HA2.

The structure of the dummy block DBLK is similar to the structure of the active block ABLK, and thus the wiring resistance in the dummy block DBLK is the same as the resistance of a wiring formed in the same layer in the active block ABLK. In other words, in the comparative example, the resistance value of a wiring provided in the dummy block DBLK is measured, and thus the resistance value of the wiring provided in the active block ABLK can be estimated.

On the other hand, in the semiconductor memory 1 according to the first embodiment, among the slits SHE provided in the dummy block DBLK, at least one slit SHE is replaced with the slit SHEs, and thus the resistance value of the select gate line SGD of the active block ABLK can be estimated.

Figure 17:
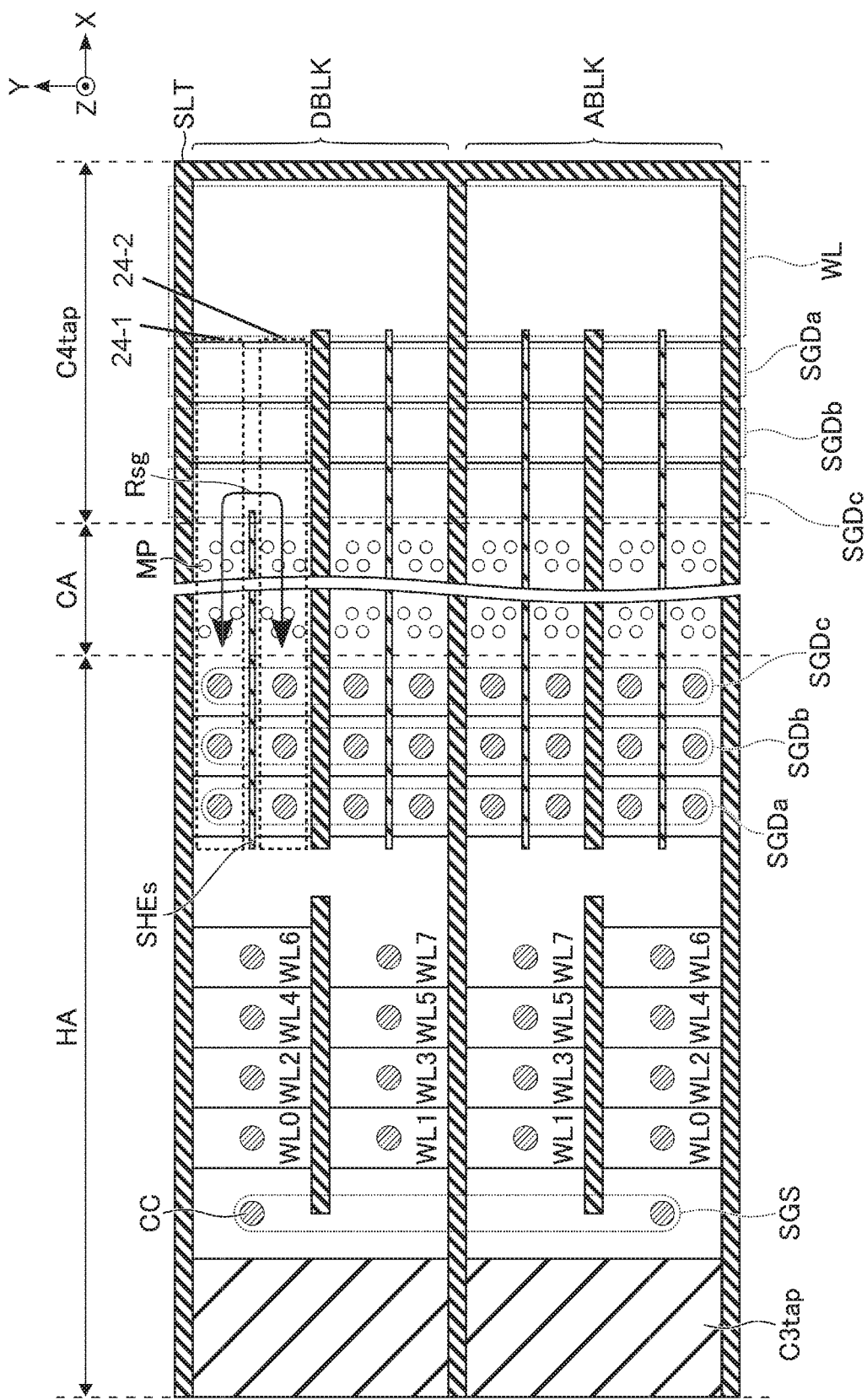
FIG. 17 illustrates a plan view of the memory cell array to illustrate an example of a wiring resistance measurement path in the semiconductor memory according to the first embodiment.

FIG. 17 illustrates an example of a method of measuring a resistance value of the select gate line SGD in the semiconductor memory 1 according to the first embodiment.

As illustrated in FIG. 17, in the semiconductor memory 1 according to the first embodiment, the slit SHE separates the select gate line SGD provided in the string units SU adjacent to each other. Thus, two contacts CC adjacent to each other are insulated from each other via the slit SHE.

On the other hand, the slit SHEs provided in the dummy block DBLK separates the select gate lines SGD in the lead region HA and the cell region CA, but does not separate the select gate lines SGD in the C4 connection region C4*tap*.

Thus, two contacts CC adjacent to each other via the slit SHEs are electrically connected to each other in the C4 connection region C4*tap*. Specifically, a current path between two contacts CC adjacent to each other via the slit SHEs passes through the cell region CA twice as indicated by arrow "Rsg" in FIG. 17.

As described above, in the semiconductor memory 1 according to the first embodiment, the resistance between the two contacts CC adjacent to each other via the slit SHEs can be measured via the end part region of the slit SHEs. The resistance value between the two contacts CC adjacent to each other via the slit SHEs is the roughly twice the resistance value of a wiring connected to the contacts CC.

In the semiconductor memory 1 according to the first embodiment, a resistance between the select gate lines SGD adjacent to the slit SHEs in the dummy block DBLK is measured, and thus a resistance value of the select gate line SGD in the active block ABLK can be estimated.

As described above, in the semiconductor memory 1 according to the first embodiment, a resistance value of the select gate line SGD in the active block ABLK can be estimated without a significant design change, and thus it is possible to reduce development cost for the semiconductor memory 1.

2. Second Embodiment

In a semiconductor memory 1 according to a second embodiment, the same structure as that of the select gate line SGD in the dummy block DBLK in the first embodiment is formed in the word line WL in the dummy block DBLK. In the following, with respect to the semiconductor memory 1 according to the second embodiment, differences from the first embodiment will be described.

2-1. Structure of Semiconductor Memory 1

Figure 18:
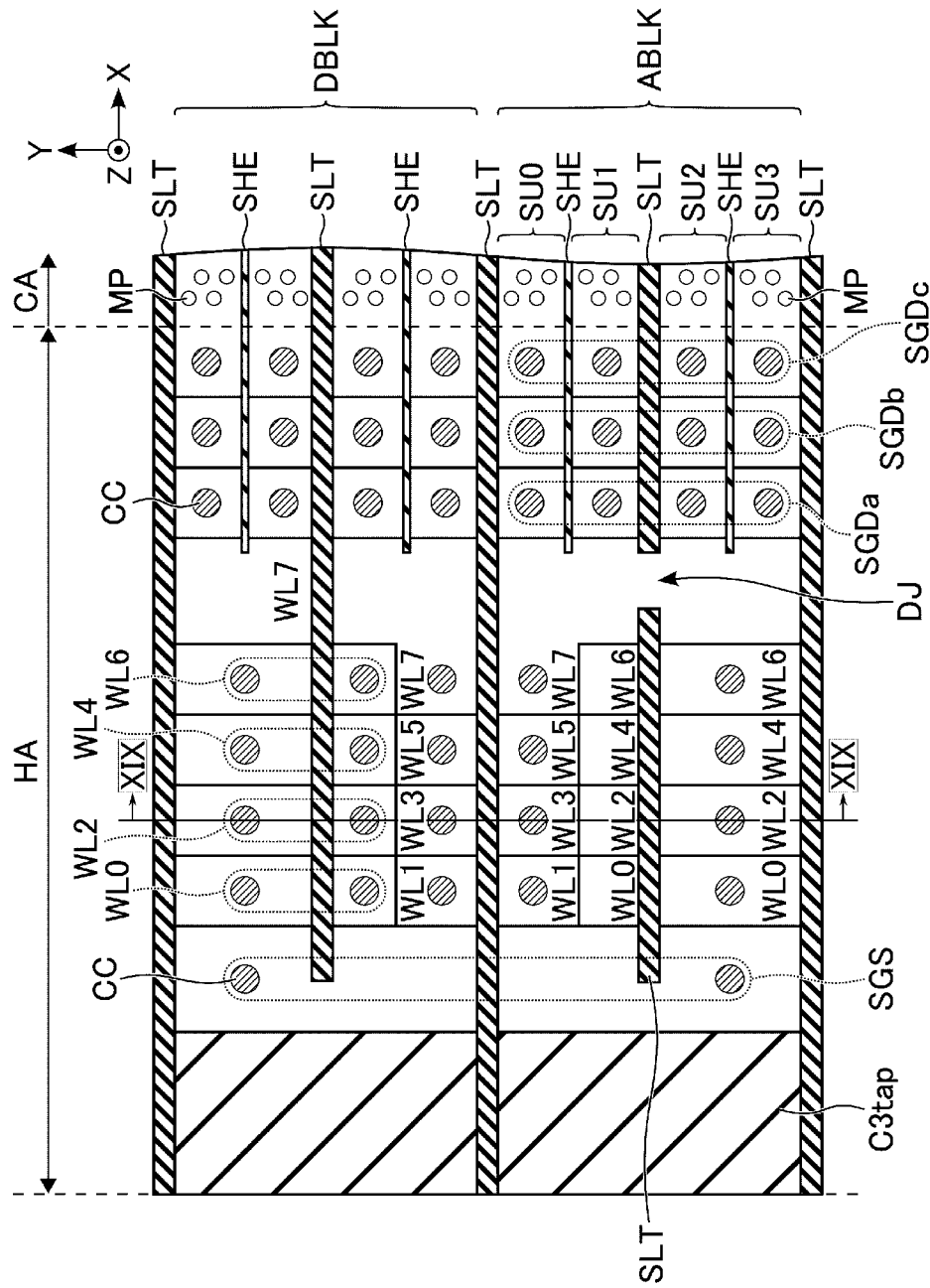
FIG. 18 illustrates a plan view of an example of a lead region of a memory cell array of a semiconductor memory according to a second embodiment.

FIG. 18 illustrates an example of a planar layout of the lead region HA of the memory cell array 10 of the semiconductor memory 1 according to the second embodiment by extracting one active block ABLK and one dummy block DBLK.

As illustrated in FIG. 18, a planar layout of the lead region HA in the second embodiment is different from a planar layout of the lead region HA in the first embodiment in terms of layout and configuration of a stepped portion of the word line WL in the dummy block DBLK.

Specifically, the slit gap DJ is omitted from the horizontal-direction slit SLT formed in the dummy block DBLK in the second embodiment. In other words, in the lead region HA, the horizontal-direction slit SLT in the dummy block DBLK is continuously formed to separate the word lines WL.

In the dummy block DBLK in the second embodiment, there is a difference in the position of the step difference portion formed in the Y direction in the two-row steps of the word lines WL. For example, the step difference portion is shifted toward the word lines WL1, WL3, WL5, and WL7. The horizontal-direction slit SLT formed in the dummy block DBLK separates terrace portions of the word lines WL0, WL2, WL4, and WL6.

A contact CC is provided in each of two separated terrace portions of the word lines WL0, WL2, WL4, and WL6. Each of the two contacts CC which are adjacent to each other via the slit SLT and are connected to the terrace portions of the word lines WL is connected to a micro-pad in the same manner as in the first embodiment.

In this example of the dummy block DBLK in the second embodiment, the slit SHEs provided in the dummy block DBLK in the first embodiment is replaced with the slit SHE. A planar layout of the active block ABLK in the second embodiment may be the same as that in the semiconductor memory 1 according to the first embodiment. The position of the two-row steps of the word lines WL whose step difference portion is formed in the Y direction may be shifted in the same manner as in the dummy block DBLK.

Figure 19:
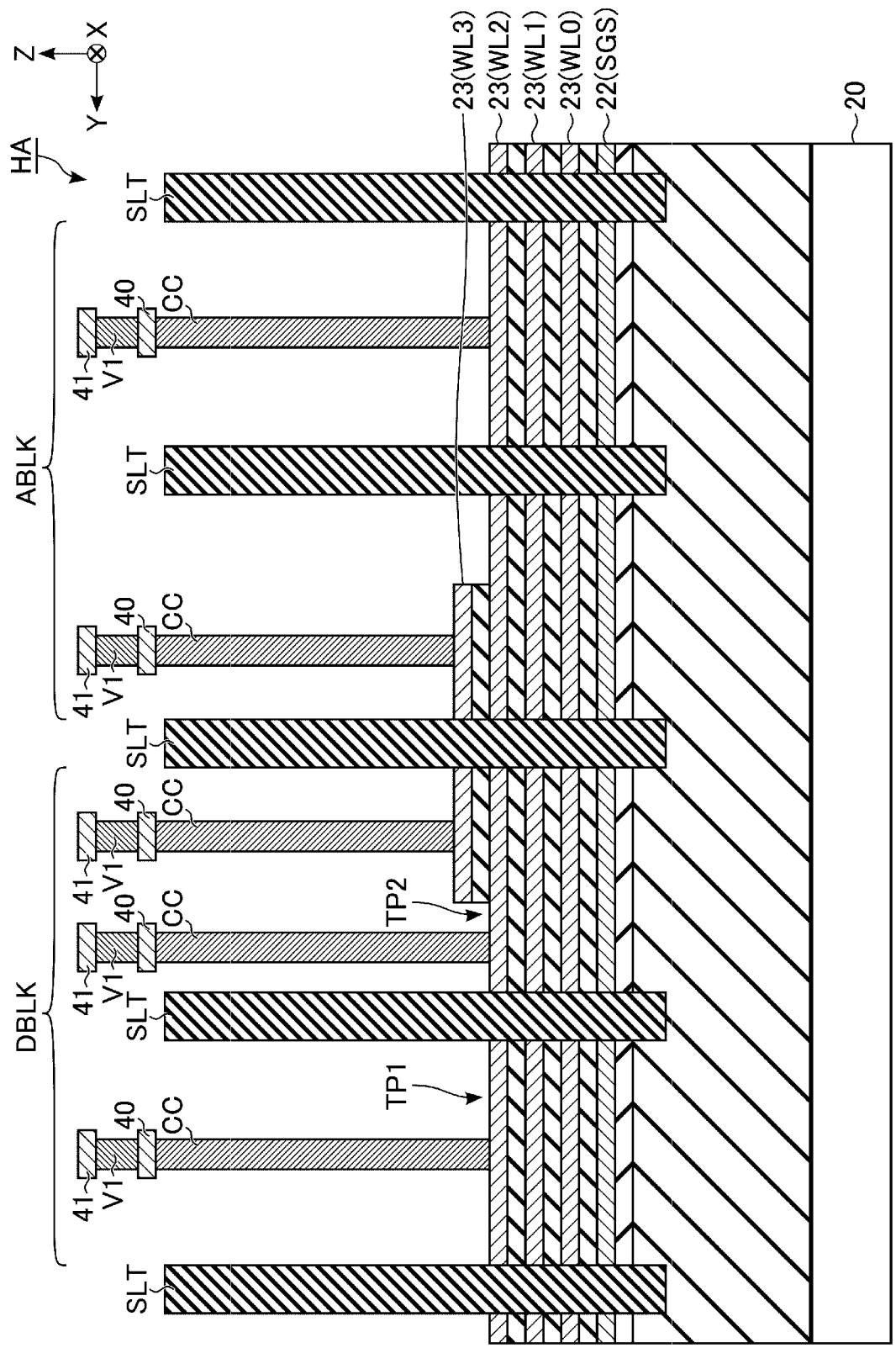
FIG. 19 illustrates a cross-sectional view of an example of the lead region of the memory cell array of the semiconductor memory according to the second embodiment.

In the following, a specific example of a cross-sectional structure of the dummy block DBLK in the second embodiment is explained with reference to FIG. 19. FIG. 19 illustrates a cross-sectional view of the memory cell array 10 taken along the line XIX-XIX in FIG. 18, and illustrates a cross-sectional structure of the memory cell array 10 including terrace portions of the word lines WL2 and WL3 and a terrace portion between the word lines WL2 and WL3.

As illustrated in FIG. 19, the horizontal-direction slit SLT provided in the dummy block DBLK separates the conductor 22 and a plurality of conductors 23 respectively used as the word lines WL0 to WL2. Similarly, the horizontal-direction slit SLT provided in the active block ABLK separates the conductor 22 and a plurality of conductors 23 respectively used as the word lines WL0 to WL2. The horizontal-direction slit SLT provided between the dummy block DBLK and the active block ABLK separates the conductor 22 and a plurality of conductors 23 respectively used as the word lines WL0 to WL3.

A step difference portion of the word lines WL2 and WL3 formed in the dummy block DBLK is shifted toward the active block ABLK. Thus, two terrace portions TP1 and TP2 are formed in the conductor 23 corresponding to the word line WL2 in the dummy block DBLK. The contact CC is formed on each of the terrace portions TP1 and TP2. The contact CC connected to the terrace portion TP1 and the contact CC connected to the terrace portion TP2 are electrically connected to different micro-pads in a region (not illustrated).

Figure 20:
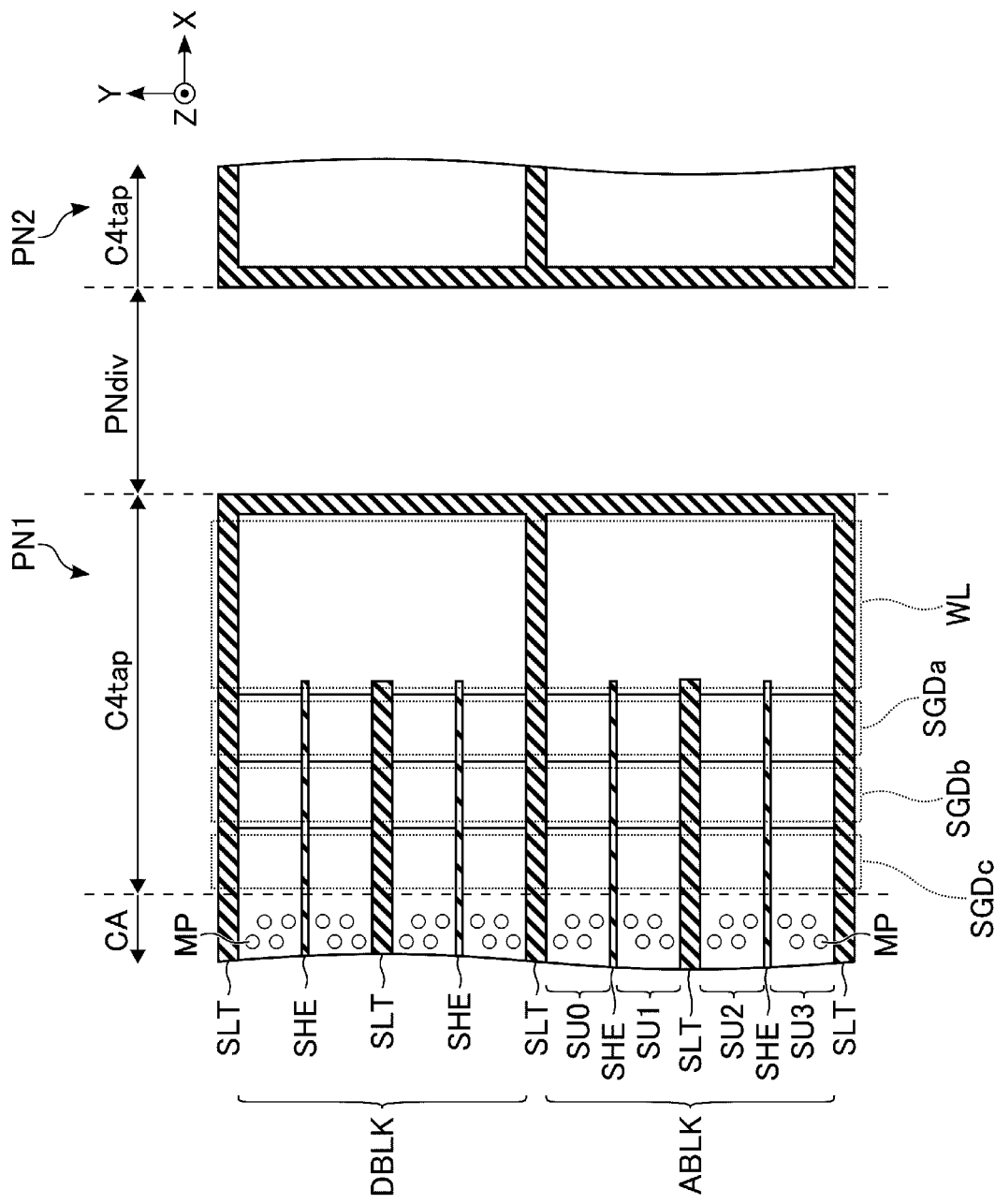
FIG. 20 illustrates a plan view of an example of the vicinity of a plane separation region of the semiconductor memory according to the second embodiment.

FIG. 20 illustrates an example of a planar layout of the vicinity of the plane separation region PNdiv of the semiconductor memory 1 according to the second embodiment by extracting one active block ABLK and one dummy block DBLK.

As illustrated in FIG. 20, in the semiconductor memory 1 according to the second embodiment, the slit SHE is provided instead of the slit SHEs in the dummy block DBLK. In other words, in the second embodiment, the planar layouts of the C4 connection region C4*tap* in the active block ABLK and in the dummy block DBLK are the same.

The rest of the configuration of the semiconductor memory 1 according to the second embodiment described above is the same as, for example, the configuration of the semiconductor memory 1 according to the first embodiment, and thus a description thereof will be omitted.

2-2. Effect of Second Embodiment

According to the semiconductor memory 1 of the second embodiment described above, in the memory cell array 10 in which only a single lead region HA is provided, it is possible to estimate a resistance value of the word line WL of the active block ABLK.

Figure 21:
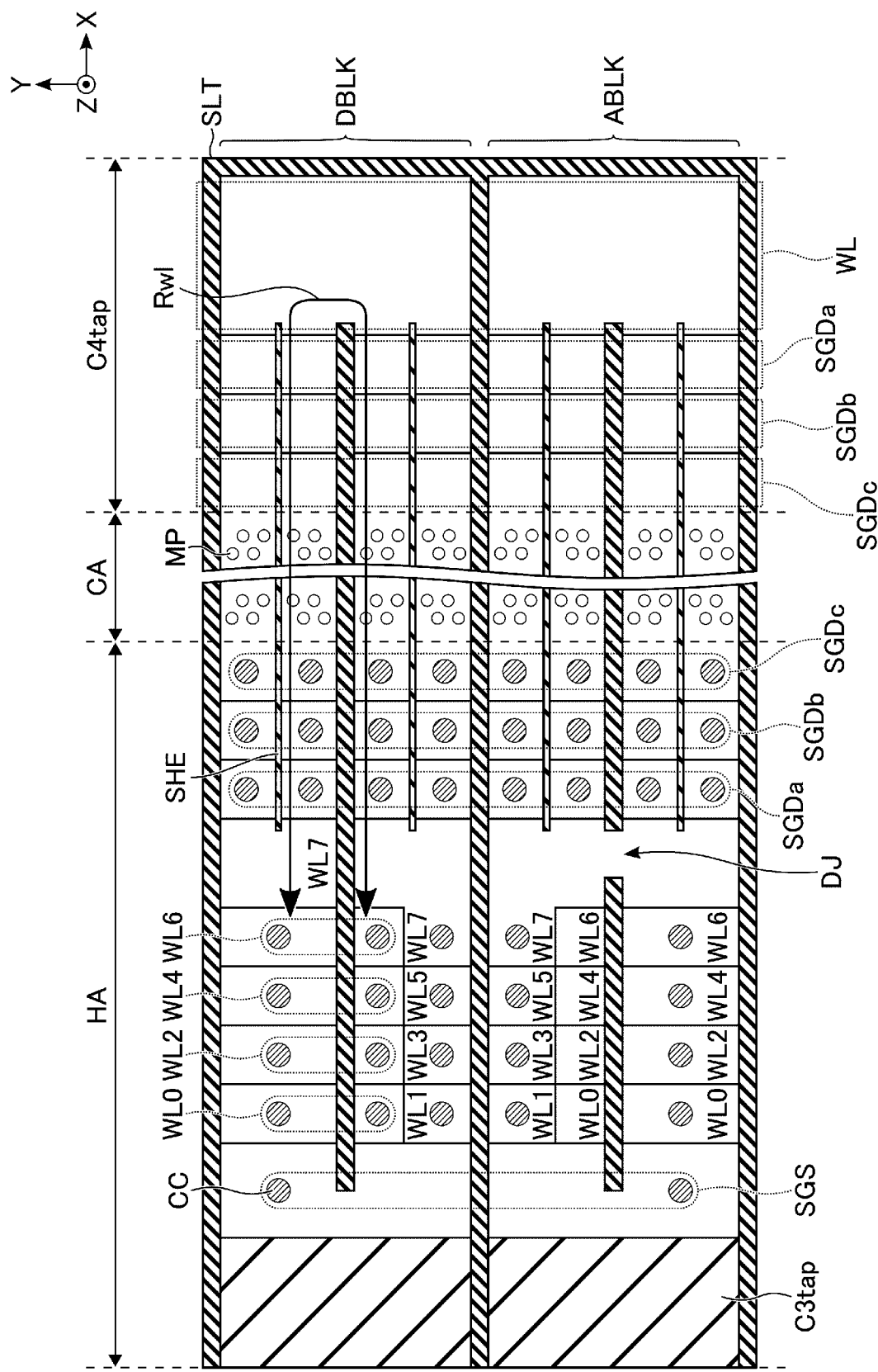
FIG. 21 illustrates a plan view of the memory cell array to illustrate an example of a wiring resistance measurement path in the semiconductor memory according to the second embodiment.

FIG. 21 illustrates an example of a method of measuring a resistance value of the word line WL in the semiconductor memory 1 according to the second embodiment.

As illustrated in FIG. 21, in the semiconductor memory 1 of the second embodiment, the horizontal-direction slit SLT provided in the active block ABLK has the slit gap DJ, and the word lines WL provided in the same layer in the active block ABLK are electrically connected to each other via the slit gap DJ.

On the other hand, the horizontal-direction slit SLT continuously formed in the dummy block DBLK. Each of the word lines WL0, WL2, WL4, and WL6 provided in the same layer in the dummy block DBLK is connected to the two contacts CC which are disposed with the slit SLT interposed therebetween. The two contacts CC are connected to different micro-pads.

Thus, the two contacts CC which correspond to the same word line WL in the dummy block DBLK and are adjacent to each other via the slit SLT are electrically connected to each other via the C4 connection region C4*tap*.

Specifically, a current path between the two contacts CC which correspond to the same word line WL in the dummy block DBLK and are adjacent to each other via the slit SLT passes through the cell region CA twice as indicated by an arrow "Rwl" in FIG. 21.

As described above, in the semiconductor memory 1 according to the second embodiment, the resistance between the two contacts CC which correspond to the same word line WL in the dummy block DBLK and are adjacent to each other via the slit SLT can be measured via the end part region of the slit SLT in the C4 connection region C4*tap*. The resistance between the two contacts CC is roughly twice the resistance value of a wiring connected to the two contacts CC.

In the semiconductor memory 1 according to the second embodiment, the resistance between the word lines WL adjacent to the slit SLT in the dummy block DBLK is measured, and thus the resistance value of the word line WL in the active block ABLK can be estimated.

As described above, in the semiconductor memory 1 according to the second embodiment, the resistance value of the word line WL in the active block ABLK can be estimated without a significant design change, and thus it is possible to reduce development cost for the semiconductor memory 1.

In the second embodiment, since the word lines WL are formed in two rows of steps, and the number of horizontal-direction slits SLT passing through the terrace portion is one, the number of word lines WL whose resistance values can be measured is ½ of the number of word lines WL provided in the dummy block DBLK.

As described above, the number of word lines WL whose resistance values can be measured by applying the second embodiment thereto changes depending on a layout of the stepped portion of the word line WL in the lead region HA and the number of horizontal-direction slits SLT formed in the dummy block DBLK.

3. Modification Example and the Like

The semiconductor memory of the embodiments includes first to third regions (for example, HA, CA, and C4*tap*) arranged in a first direction, a dummy region (for example, DBLK) including a part of each of the first to third regions, first to fourth conductors, first to third insulators, first and second pillars, and first and second contacts. The first insulator and the first conductor (for example, the conductor 23) are alternately stacked in the dummy region. The second insulator is provided on the uppermost first conductor. The second conductor (for example, the conductor 24-1 in FIG. 17) is continuously provided over the first to third regions on the second insulator. The third conductor (for example, the conductor 24-2 in FIG. 17) is continuously provided over the first to third regions on the second insulator, and is adjacent to the second conductor in a second direction intersecting the first direction. Each of a plurality of first pillars (for example, MP) penetrates through the first conductor and the second conductor in the second region. Each of a plurality of second pillars (for example, MP) penetrates through the first conductor and the third conductor in the second region. The first and second contacts (for example, CC) are respectively provided on the second and third conductors in the first region. The third insulator (for example, SLT) is provided between the second conductor and the third conductor in each of the first region and the second region. The fourth conductor (for example, the conductor 23 in the C4 connection region C4*tap*) is provided between the second conductor and the third conductor in the third region, and electrically connects the second conductor to the third conductor. Consequently, it is possible to easily estimate a resistance value of a wiring connected to a NAND string.

In the structure of the memory cell array 10 described in the embodiments, the memory pillar MP may have a structure in which a plurality of pillars are connected to each other in the Z direction. For example, the memory pillar MP may have a structure in which a plurality of pillars each penetrating through a plurality of conductors 23 are connected to each other in the Z direction. The memory pillar MP may have a structure in which a pillar penetrating through the conductors 22 and 23 and a pillar penetrating through the conductor 24 are connected to each other. In this case, the slit SLT does not separate, for example, the conductor 24, and the conductor 24 is separated by a slit which is different from the slit SLT.

In the embodiments, a description has been made of an example in which the region of the memory cell array 10 includes a single C4 connection region C4*tap*, but a plurality of C4 connection regions C4*tap* may be provided in the cell region CA. The number of C4 connection regions C4*tap* inserted into the cell region CA may be designed to be any number.

In the embodiments, a description has been made of an example in which the contacts CS and C4 are provided in the C4 connection region C4*tap* adjacent to the plane separation region PNdiv, but the contacts CS and C4 need not be provided in the C4 connection region C4*tap* adjacent to the plane separation region PNdiv. It is sufficient that a terrace portion of each select gate line SGD is formed in the C4 connection region C4*tap* adjacent to the plane separation region PNdiv.

Figure 22:
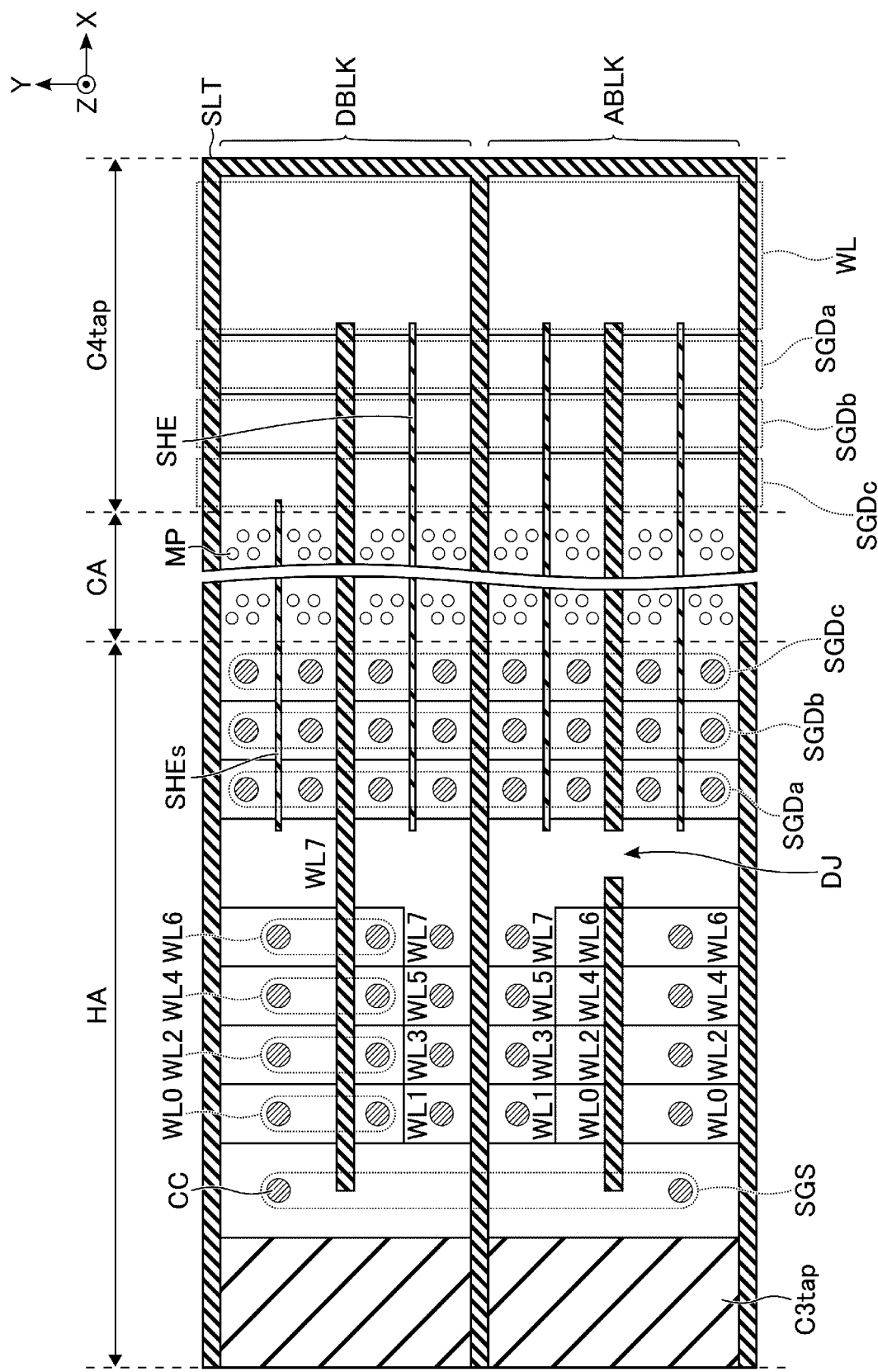
FIG. 22 illustrates a plan view of an example of a memory cell array in a combination of the first embodiment and the second embodiment.

The first embodiment and the second embodiment may be combined with each other. FIG. 22 illustrates a plan view of an example of the memory cell array 10 in a combination of the first embodiment and the second embodiment.

As illustrated in FIG. 22, the slit SHEs is provided in the dummy block DBLK. The slit gap DJ is omitted from the horizontal-direction slit SLT provided in the dummy block DBLK, and a step difference portion of the word line WL in the Y direction is shifted. In the same word line WL, the contact CC is provided in each of two terrace portions formed by the horizontal-direction slit SLT, and each contact CC is connected to a micro-pad.

As described above, in a case where the semiconductor memory 1 includes the dummy block DBLK having the characteristics of the first embodiment and the second embodiment, resistance values of the word line WL and the select gate line SGD can be measured by using the dummy block DBLK.

In the embodiments, a description has been made of an exemplary case where the word lines WL form two rows of steps in the lead region HA, but the structure is not limited to this example. For example, in the lead region HA, end parts of the word lines WL may be formed in one row of steps, and may be formed in three or more rows of steps.

Figure 23:
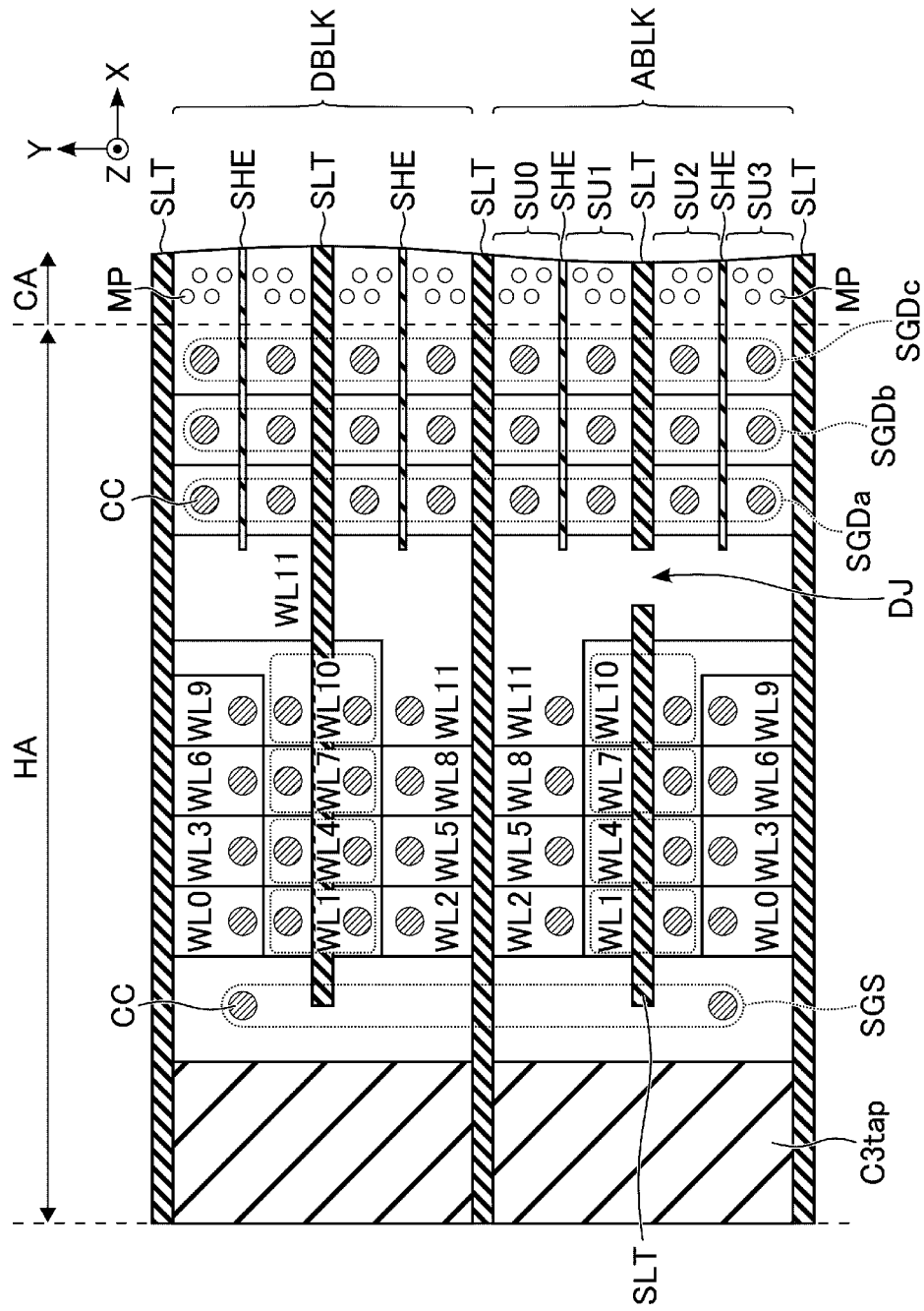
FIG. 23 illustrates a plan view of an example of the memory cell array in a modification example of the second embodiment.

FIG. 23 illustrates an example of a planar layout of the lead region HA of the memory cell array 10 of the semiconductor memory 1 according to a modification example of the second embodiment. FIG. 23 illustrates a case where the number of word lines WL is twelve (that is, word lines WL0 to WL11).

As illustrated in FIG. 23, end parts of the word lines WL form three rows of steps in both the active block ABLK and the dummy block DBLK. Specifically, in the active block ABLK, a plurality of conductors 23 respectively corresponding to the word lines WL0 to WL11 are provided with, for example, two step differences in the Y direction, and a stepped shape of three rows in the X direction.

Also in this case, the horizontal-direction slit SLT in the active block ABLK has the slit gap DJ. The slit gap DJ is provided, for example, in the vicinity of a terrace portion of the word line WL10. As described above, in a case where the steps of three rows are formed, the word lines WL have a short-circuited portion in the active block ABLK of the lead region HA.

The layout of the word lines WL in the dummy block DBLK adjacent to the active block ABLK is the same as a layout obtained by inverting the layout of the word lines WL in the active block ABLK about the axis in the X direction. As described in the second embodiment, the slit SLT in the dummy block DBLK is continuously formed without having the slit gap DJ.

In a case of the layout illustrated in FIG. 23, the horizontal-direction slit SLT in the dummy block DBLK separates the word lines WL1, WL4, WL7, and WL10 in the lead region HA. Thus, each of the word lines WL1, WL4, WL7, and WL10 has two terrace portions. In the dummy block DBLK, the contacts CC are respectively provided in the two terrace portions, and are electrically connected to different micro-pads.

Consequently, in the example illustrated in FIG. 23, it is possible to measure the resistance value of each of the word lines WL1, WL4, WL7, and WL10 connected to the two micro-pads. The rest of the configuration of the semiconductor memory 1 in the modification example of the second embodiment may be the same as the configuration of the semiconductor memory 1 according to the second embodiment, and the slit SHEs may be provided in the dummy block DBLK as in the first embodiment.

In the first embodiment, a description has been made of an example where the terrace portion of each select gate line SGD is formed in the C4 connection region C4*tap* adjacent to the plane separation region PNdiv, but the structure is not limited to this. For example, the structure of the select gate line SGD in the vicinity of the plane separation region PNdiv may be the same as a structure of the word lines WL in the plane separation region PNdiv.

Figure 24:
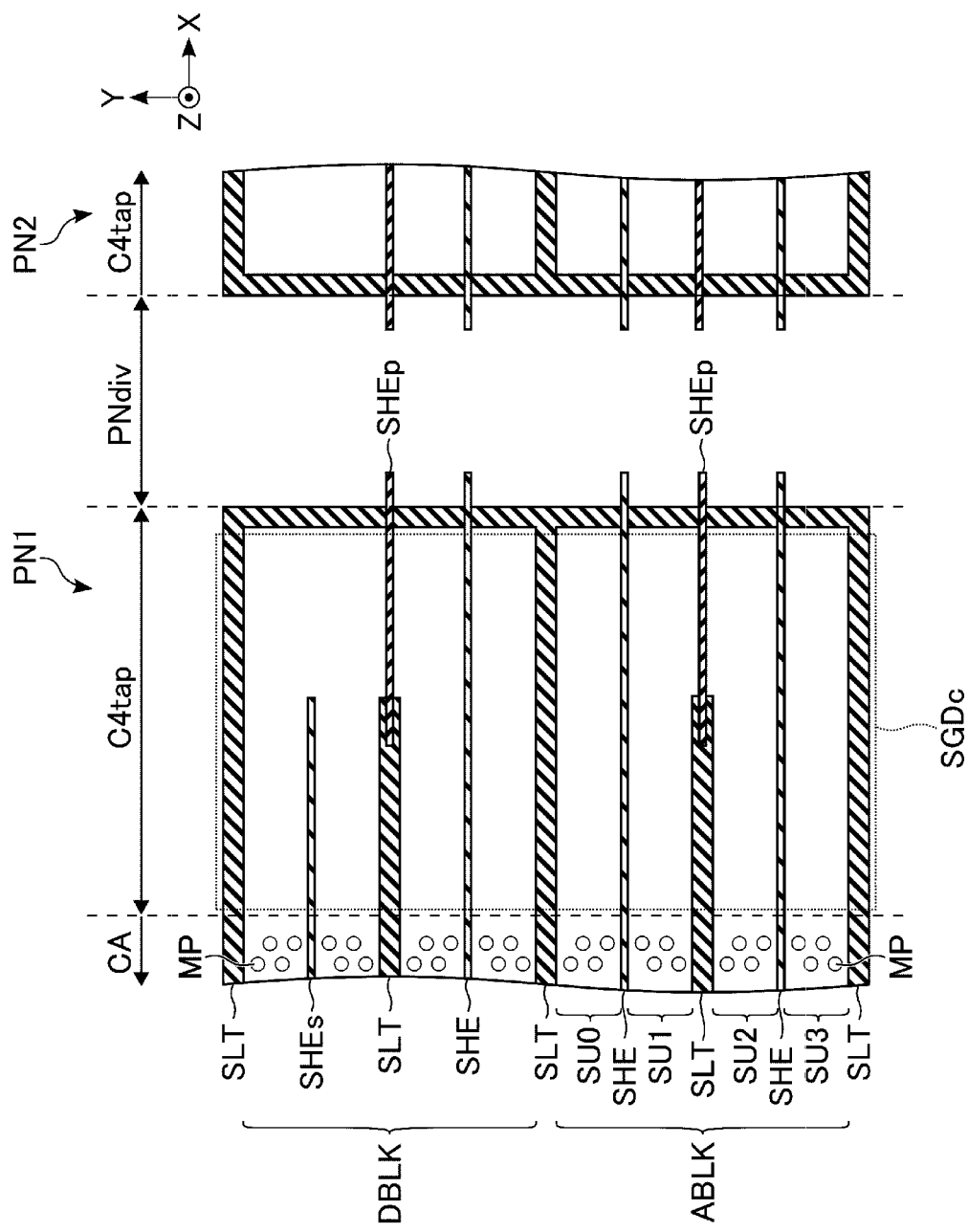
FIG. 24 illustrates a plan view of an example of the vicinity of a plane separation region of a semiconductor memory according to a first modification example of the first embodiment.

FIG. 24 illustrates a plan view of an example of the vicinity of the plane separation region PNdiv of the semiconductor memory 1 according to a first modification example of the first embodiment.

As illustrated in FIG. 24, a planar layout of the memory cell array 10 in the first modification example is different from the planar layout of the memory cell array 10 in the first embodiment described in FIG. 13 with regard to the configuration of a terrace portion and the position of the slit SHE.

Specifically, only a terrace portion of the select gate line SGDc corresponding to the uppermost conductor 24 is provided in the C4 connection region C4tap. An end part of the slit SHE extends further toward the plane separation region PNdiv side than in the first embodiment, and thus intersects the horizontal-direction slit SLT.

In the memory cell array 10 in the first modification example, a slit SHEp extending in the X direction is provided to overlap an end part of the horizontal-direction slit SLT disposed in the active block ABLK, and the vertical-direction slit SLT. For example, the slit SHEp is disposed to intersect the vertical-direction slit SLT.

Figure 25:
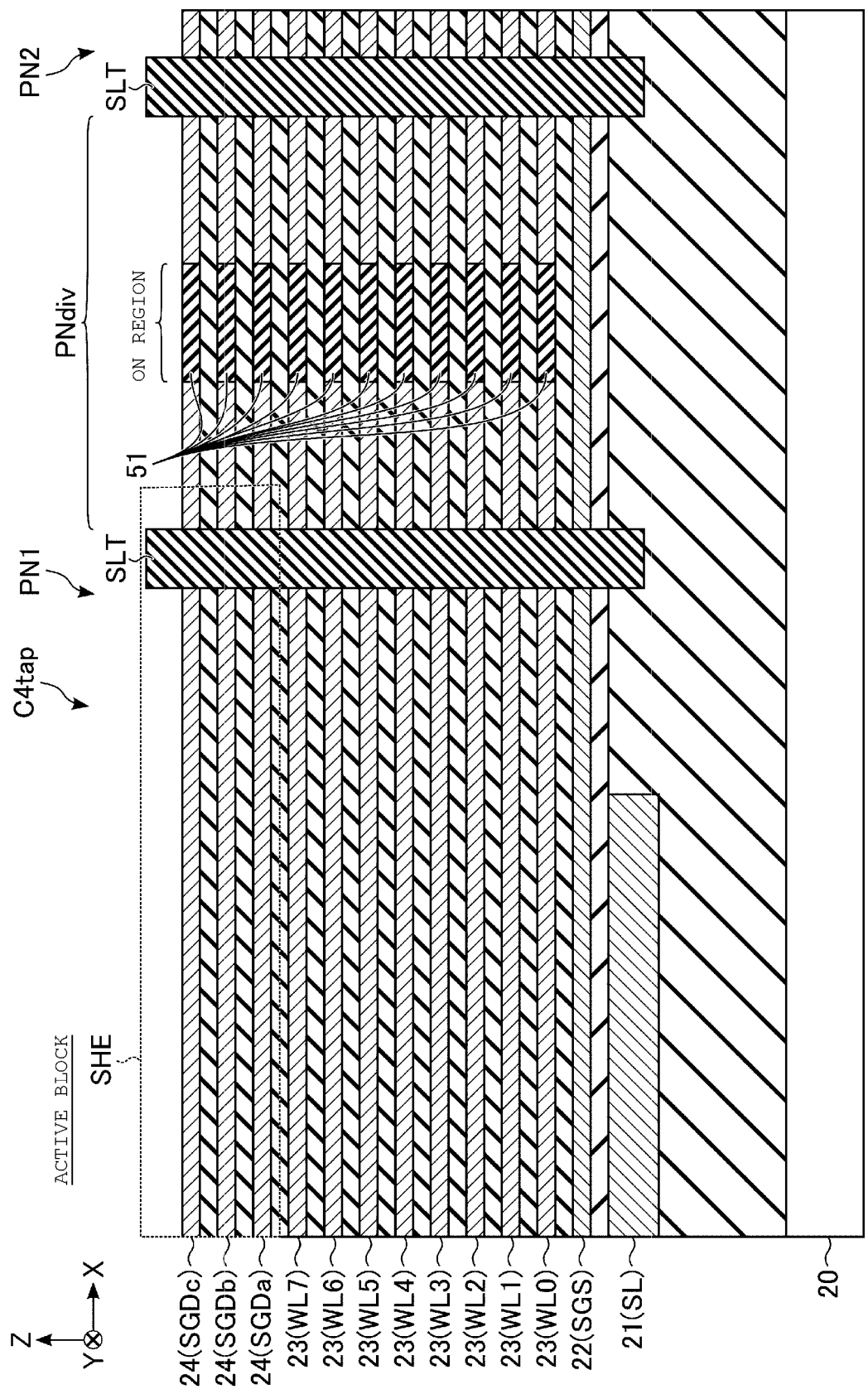
FIG. 25 illustrates a cross-sectional view of an example of the vicinity of the plane separation region of the semiconductor memory according to the first modification example of the first embodiment.
Figure 26:
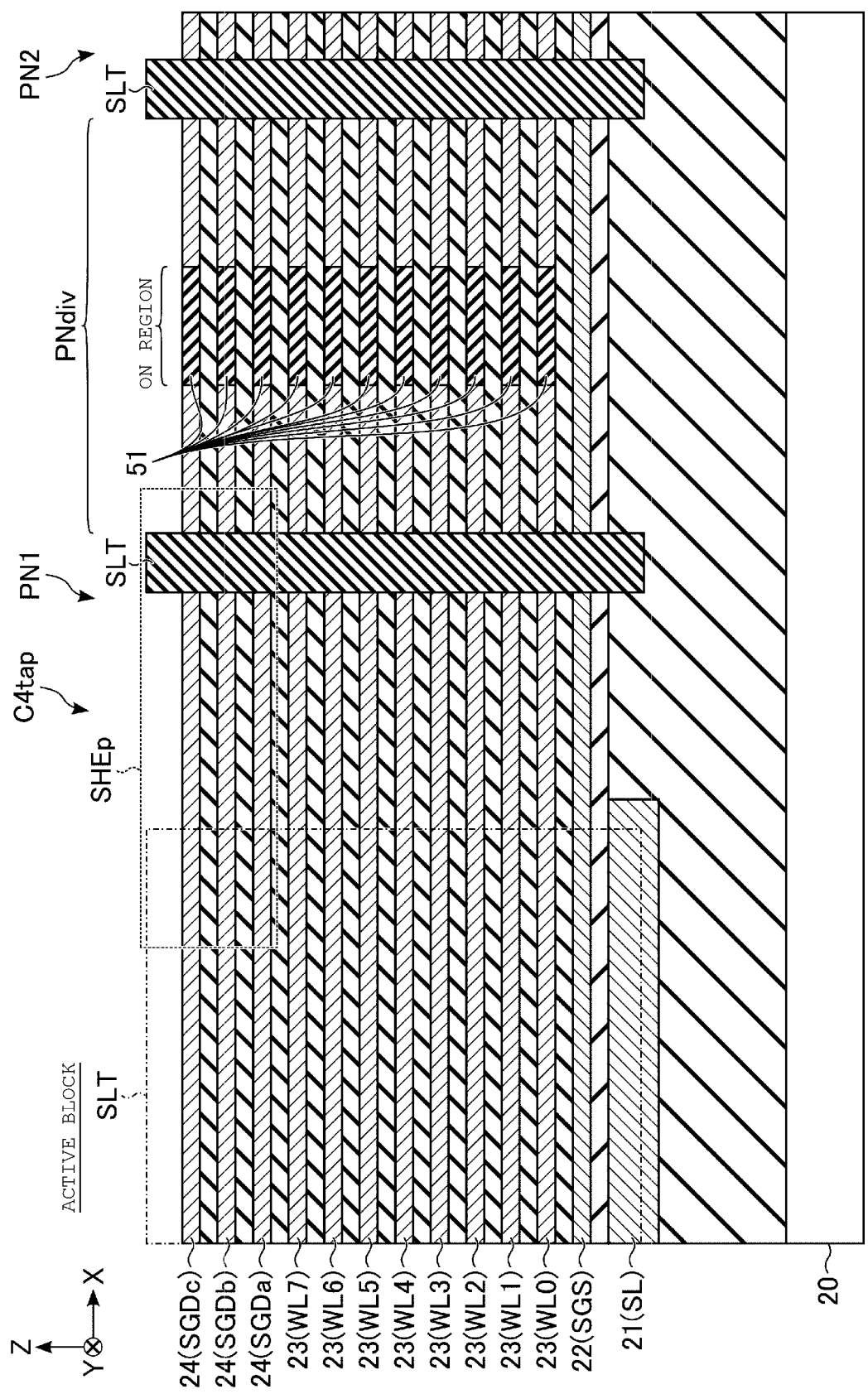
FIG. 26 illustrates a cross-sectional view of an example of the vicinity of the plane separation region of the semiconductor memory according to the first modification example of the first embodiment.
Figure 27:
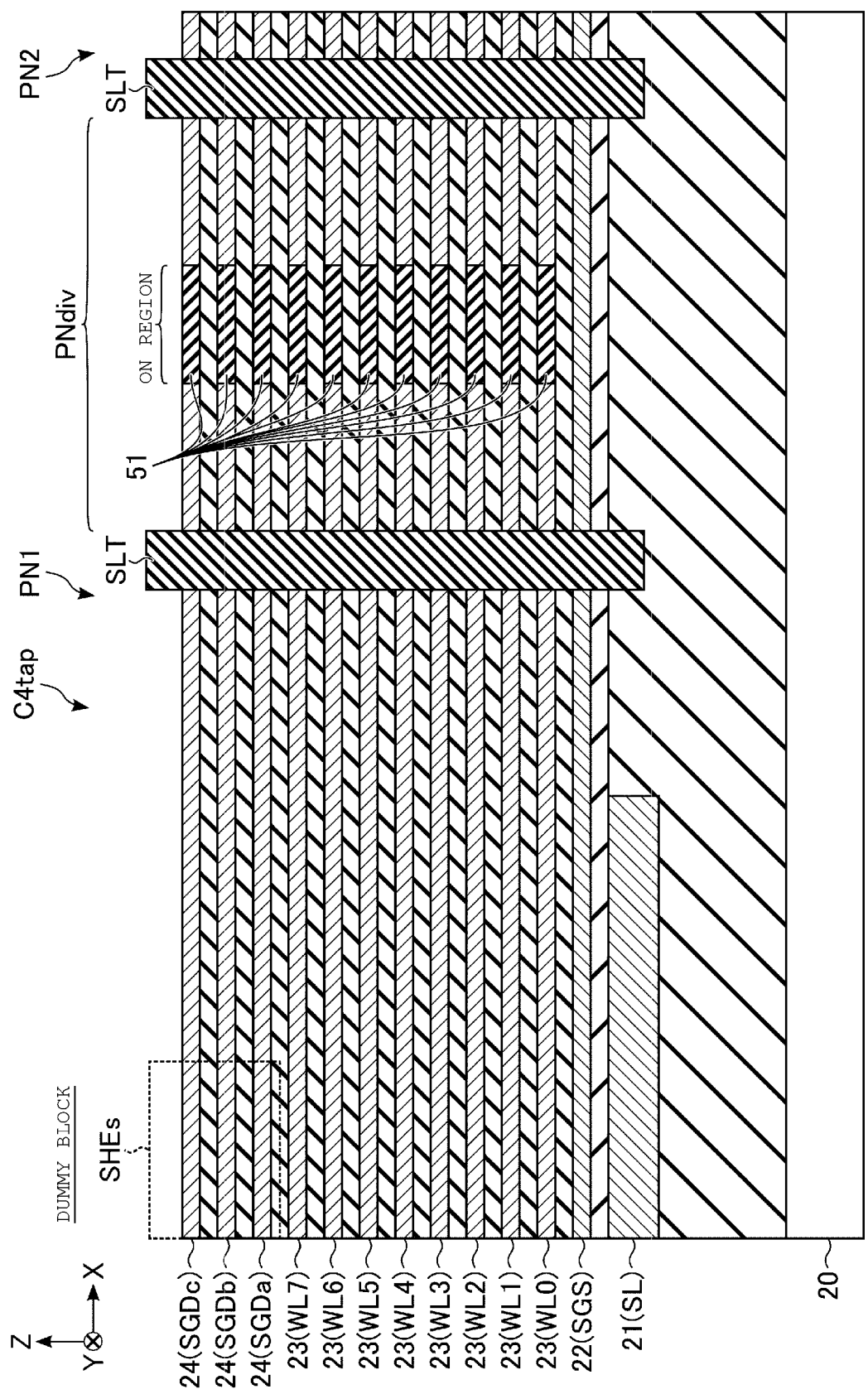
FIG. 27 illustrates a cross-sectional view of an example of the vicinity of the plane separation region of the semiconductor memory according to the first modification example of the first embodiment.

Each of FIGS. 25 to 27 illustrates an example of a cross-sectional structure of the memory cell array 10 along the X direction, illustrated in FIG. 24. FIG. 25 illustrates the position of the slit SHE, FIG. 26 illustrates the positions of the horizontal-direction slit SLT and the slit SHEp, and FIG. 27 illustrates the position of the slit SHEs. In FIGS. 25 to 27, elements related to the contacts CS and C4 are not illustrated.

As illustrated in FIG. 25, in the first modification example, a plurality of conductors 24 respectively corresponding to the select gate lines SGDa, SGDb, and SGDc extend to the middle of the plane separation region PNdiv, and are separated by the vertical-direction slit SLT.

The structure of a wiring layer corresponding to the select gate line SGD in the plane separation region PNdiv is the same as, for example, the structure of a wiring layer corresponding to the word line WL in the plane separation region PNdiv. Specifically, the wiring layer corresponding to the select gate line SGD has an ON region formed in the plane separation region PNdiv. In other words, in the plane separation region PNdiv, the insulators 51 are provided between the conductors 24 in contact with the vertical-direction slit SLT of the plane PN1 and the conductors 24 in contact with the vertical-direction slit SLT of the plane PN2.

The slit SHE indicated by the dashed line in FIG. 25 is provided to intersect the vertical-direction slit SLT, and separates all of the conductors 24 in the C4 connection region C4tap. In other words, the select gate lines SGDa, SGDb, and SGDc are separated by the slit SHE in the C4 connection region C4tap.

As illustrated in FIG. 26, the slit SHEp indicated by a dashed line is provided to overlap the horizontal-direction slit SLT and the vertical-direction slit SLT, and separates all of the conductors 24 in the C4 connection region C4tap. In other words, the select gate lines SGDa, SGDb, and SGDc are separated by the slits SLT and SHEp in the C4 connection region C4tap. The rest of the structure of the memory cell array 10 in FIG. 26 is the same as, for example, the structure of the memory cell array 10 described with reference to FIG. 25.

As illustrated in FIG. 27, an end part of the slit SHEs indicated by a dashed line is provided in the C4 connection region C4tap, and is separated from the vertical-direction slit SLT. Thus, the conductors 24 adjacent to each other via the slit SHEs are electrically connected to each other via the conductor 24 provided between the slit SHEs and the vertical-direction slit SLT. The rest of the structure of the memory cell array 10 in FIG. 27 is the same as, for example, the structure of the memory cell array 10 described with reference to FIG. 25.

FIGS. 24 to 27 illustrate a case where each of the slits SHE and SHEp intersects the vertical-direction slit SLT, but an end part of each of the slits SHE and SHEp should extend to at least the vertical-direction slit SLT.

The slit SHE in the plane PN1 and the slit SHE in the plane PN2 may be continuously provided via the plane separation region PNdiv. Similarly, the slit SHEp in the plane PN1 and the slit SHEp in the plane PN2 may be continuously provided via the plane separation region PNdiv.

In the semiconductor memory 1 according to the first modification example of the first embodiment described above, it is also possible to measure the resistance value of the select gate line SGD by using the dummy block DBLK in the same manner as in the first embodiment.

Figure 28:
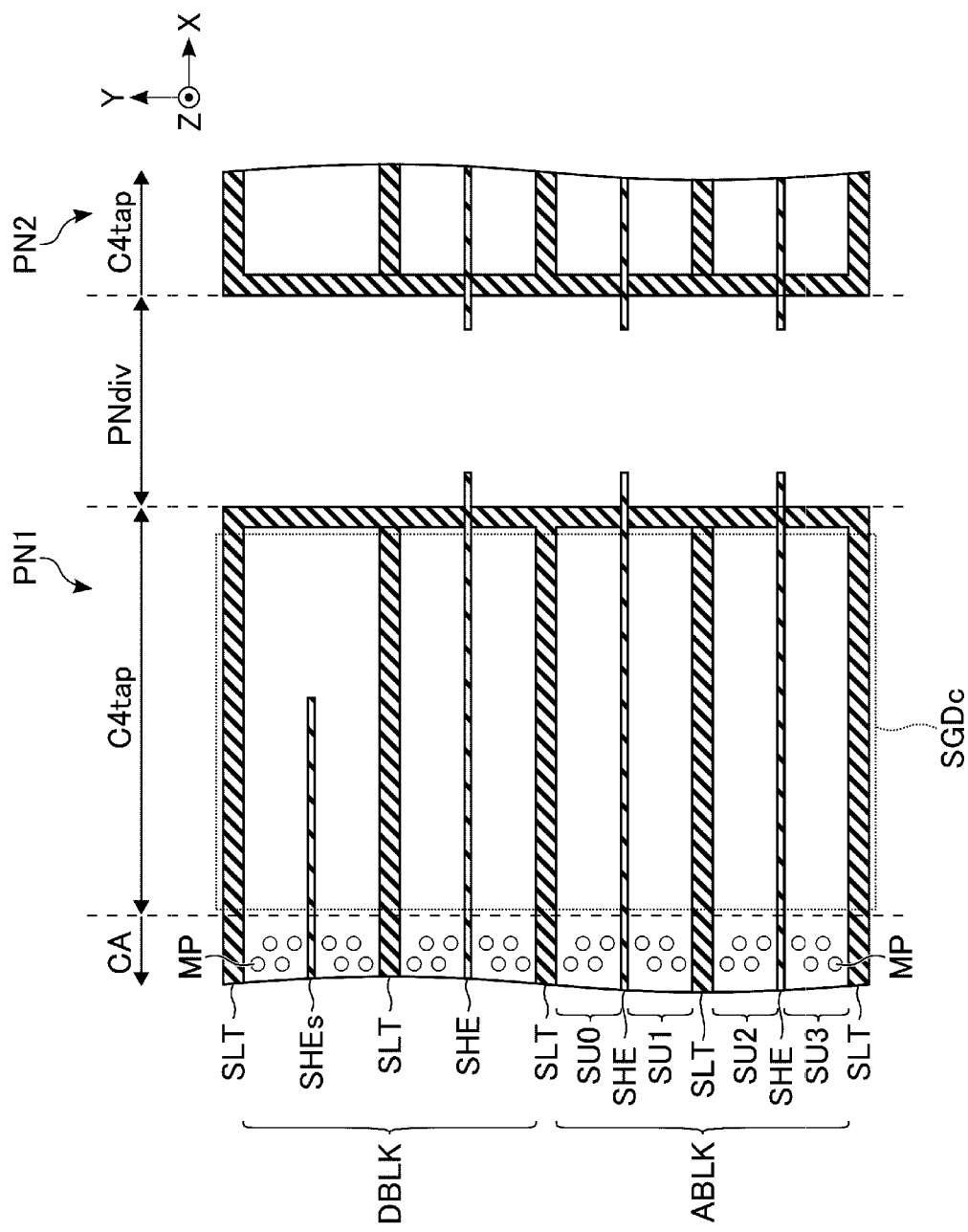
FIG. 28 illustrates a plan view of an example of the vicinity of a plane separation region of a semiconductor memory according to a second modification example of the first embodiment.

FIG. 28 illustrates an example of a planar layout of the vicinity of the plane separation region PNdiv of the semiconductor memory 1 according to a second modification example of the first embodiment.

As illustrated in FIG. 28, a planar layout of the memory cell array 10 in the second modification example is different from the planar layout of the memory cell array 10 in the first modification example described with reference to FIG. 24 with respect to the position of the horizontal-direction slit SLT since the slit SHEp is omitted.

Specifically, in the memory cell array 10 in the second modification example, the horizontal-direction slit SLT disposed in the active block ABLK or the dummy block DBLK extends to the vertical-direction slit SLT of the corresponding plane.

Figure 29:
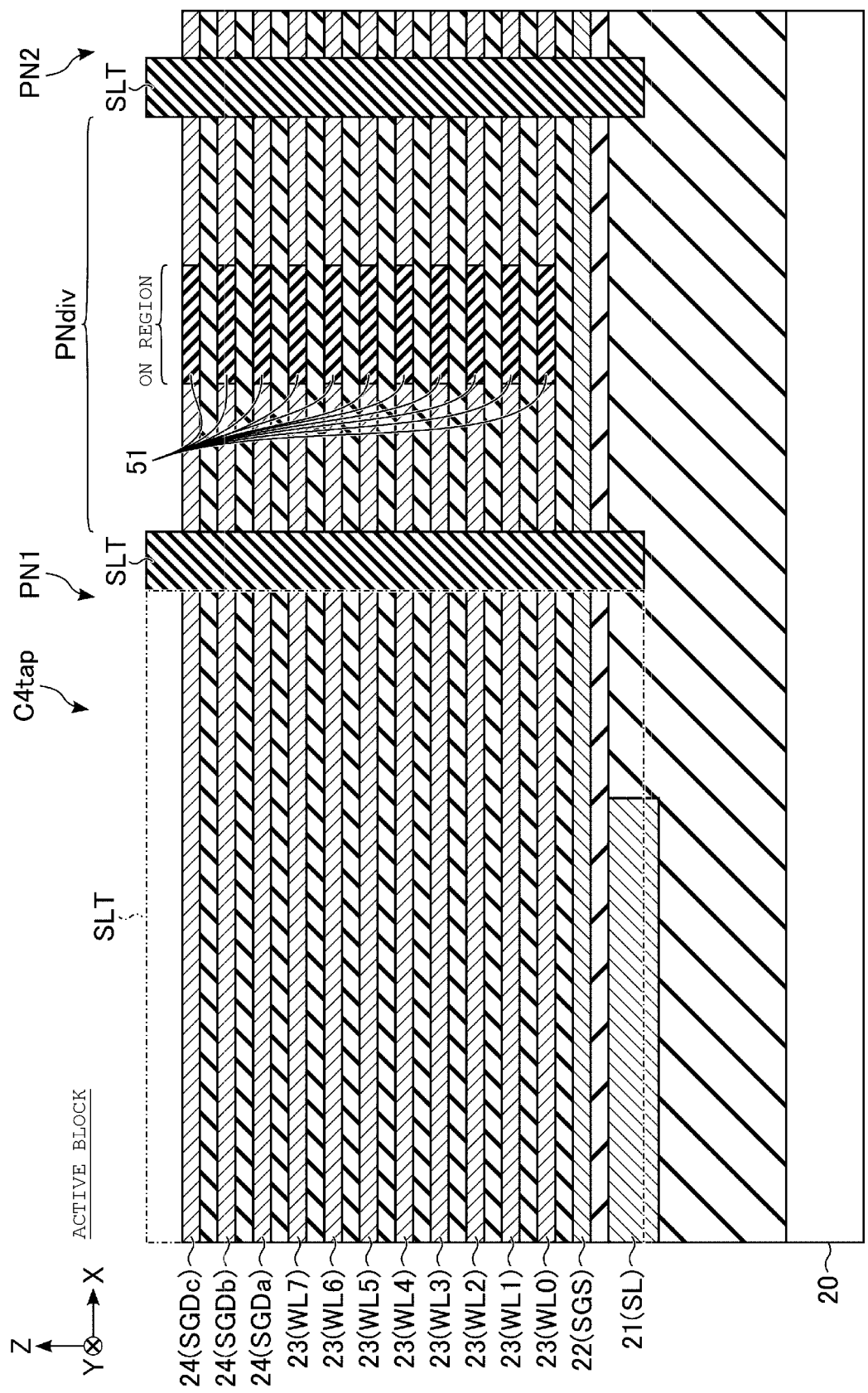
FIG. 29 illustrates a cross-sectional view of an example of the vicinity of the plane separation region of the semiconductor memory according to the second modification example of the first embodiment.

FIG. 29 illustrates an example of a cross-sectional structure of the memory cell array 10 illustrated in FIG. 28, along the X direction. In FIG. 29, the position of the horizontal-direction slit SLT provided in the block BLK is indicated by the dot chain line.

As illustrated in FIG. 29, in the second modification example, the horizontal-direction slit SLT provided in the C4 connection region C4tap is in contact with the vertical-direction slit SLT adjacent to the plane separation region PNdiv. In other words, the horizontal-direction slit SLT separates the select gate lines SGDa, SGDb, and SGDc and the word lines WL0 to WL7. The rest of the structure of the memory cell array 10 in FIG. 29 is the same as, for example, the structure of the memory cell array 10 described with reference to FIG. 25.

In the semiconductor memory 1 according to the second modification example of the first embodiment described above, it is also possible to measure the resistance value of the select gate line SGD by using the dummy block DBLK in the same manner as in the first embodiment.

Each of the first and second modification examples may be combined with the second embodiment. In a case where the second modification example is combined with the second embodiment, the dummy block DBLK with which resistance measurement for the word line WL is performed as described in the second embodiment is designed to include, for example, a horizontal-direction slit SLT which is not in contact with the vertical-direction slit SLT.

Figure 30:
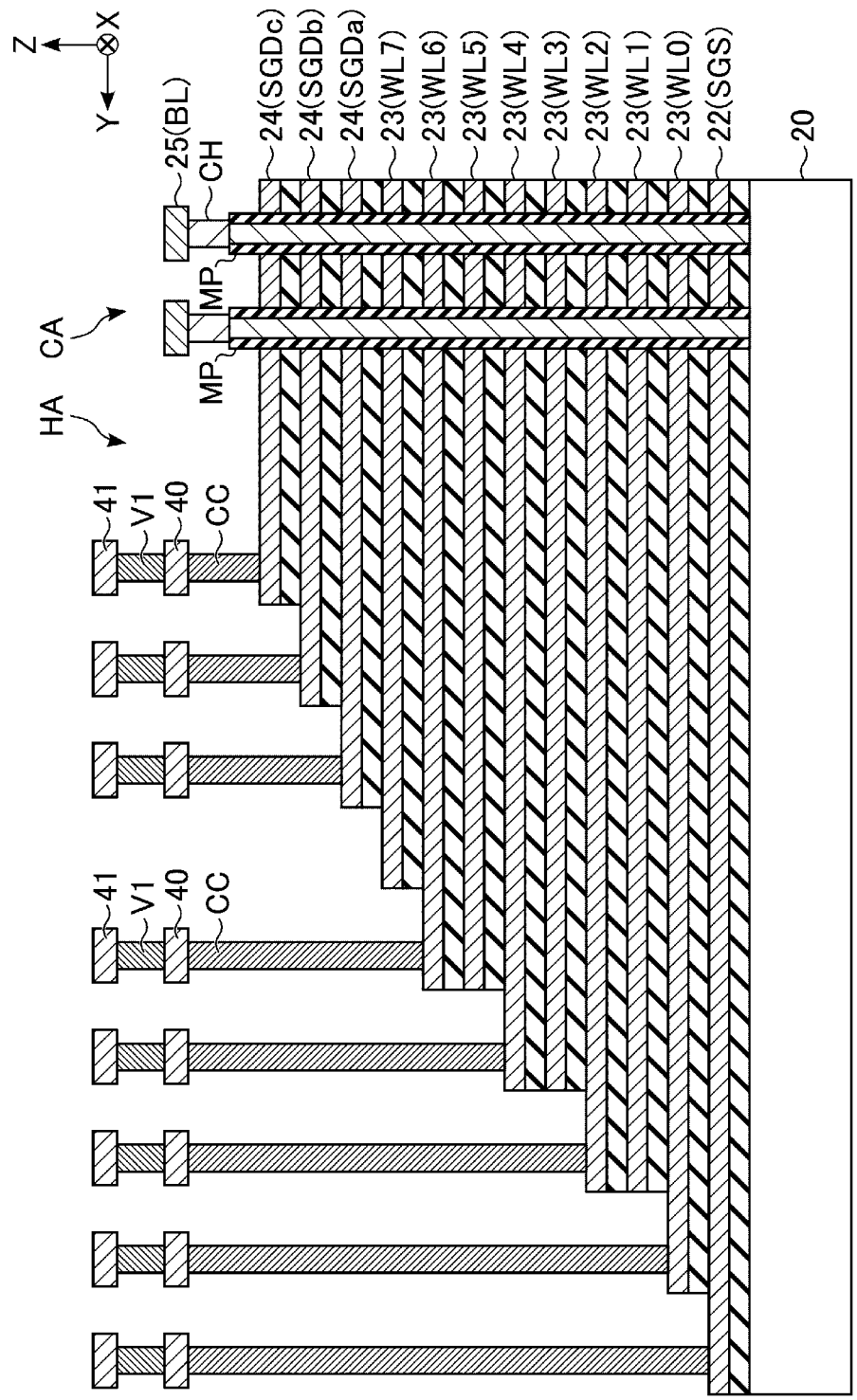
FIG. 30 illustrates a cross-sectional view of an example of a memory cell array according to a third modification example of the first embodiment.

In the embodiments, a description has been made of an exemplary case where circuits such as the row decoder module 15 are formed under the memory cell array 10, but this is only an example. FIG. 30 illustrates an example of a cross-sectional structure of the memory cell array 10 in a third modification example of the first embodiment.

As illustrated in FIG. 30, the memory cell array 10 may be formed on the semiconductor substrate 20. Specifically, the conductor 22 is stacked on the semiconductor substrate 20 via an insulating layer. An insulating layer and the conductor 23 are alternately stacked on the conductor 22. An insulating layer and the conductor 24 are alternately stacked on the uppermost conductor 23. In the cell region CA, the memory pillar MP penetrates through the conductors 22 to 24, and a bottom part of the memory pillar MP is connected to a well region (not illustrated) on the semiconductor substrate 20. The source line SL (not illustrated) is electrically connected to the well region.

In the present modification example, a stepped structure of each wiring formed in the lead region HA is the same as the structure in the memory cell array 10 described in the first embodiment. The wiring from each end part of the conductors 22 to 24 is electrically connected to the row decoder module 15 on the semiconductor substrate 20 in a region that is not illustrated.

In the present modification example, for example, a contact penetrating through stacked wirings of the memory cell array 10 is not provided in the C4 connection region C4*tap*, and the C4 connection region C4*tap* is not provided in the cell region CA. In other words, in the present modification example, only the C4 connection region C4*tap* between the planes PN1 and PN2 adjacent to each other is provided, and the C4 connection region C4*tap* is a region for forming structures of the stacked wirings and a structure of the slit SLT described in the embodiments. The rest of the structure of the semiconductor memory 1 in the present modification example is the same as, for example, the structure of the semiconductor memory 1 according to the first embodiment.

In the embodiments, whether the block BLK provided in the memory cell array 10 is the dummy block DBLK or the active block ABLK may be determined based on whether or not a block address BA is allocated thereto.

Specifically, the block address BA is not allocated to the dummy block DBLK, and the block address BA is allocated to the active block ABLK. For example, when blocks are accessed in order while increasing the block address BA by one, the block BLK which is not accessed at all may be determined as being the dummy block DBLK.

A structure of the memory cell array 10 may be other structures. Other configurations of the memory cell array 10 are disclosed in, for example, U.S. patent application Ser. No. 12/407,403, filed on Mar. 19, 2009, entitled "three-dimensional stacked nonvolatile semiconductor memory". Other configurations of the memory cell array 10 are also disclosed in U.S. patent application Ser. No. 12/406,524, filed on Mar. 18, 2009, entitled "three-dimensional stacked nonvolatile semiconductor memory", and U.S. patent application Ser. No. 12/679,991, filed on Mar. 25, 2010, entitled "nonvolatile semiconductor storage device and manufacturing the same".

Other configurations of the memory cell array 10 are also disclosed in U.S. patent application Ser. No. 12/532,030, filed on Mar. 23, 2009, entitled "semiconductor memory and manufacturing same". The overall contents of the Patent Applications are incorporated by reference in the present application.

The term "connection" in the present specification indicates that elements are electrically connected to each other, and includes the case where the elements are electrically connected to each other via other elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a stack of first conductors stacked in a first direction and separated from each other, the stack including a first region, a second region, and a third region provided in this order along a second direction crossing the first direction;
a second conductor extending in the second direction above an uppermost layer of the first conductors, the second conductor including a fourth region, a fifth region, and a sixth region provided in this order along the second direction;
a third conductor extending in the second direction above the uppermost layer of the first conductors and provided in a third direction of the second conductor, the third direction crossing the first direction and the second direction, the third conductor including a seventh region, an eighth region, and a ninth region provided in this order along the second direction;
a plurality of first pillars extending through the second region of the stack and the fifth region of the second conductor;
a plurality of second pillars extending through the second region of the stack and the eighth region of the third conductor;
a first contact plug provided on the fourth region of the second conductor; and
a second contact plug provided on the seventh region of the third conductor, wherein
the fourth region of the second conductor and the seventh region of the third conductor are separated from each other,
the fifth region of the second conductor and the eighth region of the third conductor are separated from each other, and
the sixth region of the second conductor and the ninth region of the third conductor are connected to each other.

2. The semiconductor memory according to claim 1, further comprising:
an insulating structure extending between the fourth region of the second conductor and the seventh region of the third conductor in the first direction and between the fifth region of the second conductor and the eighth region of the third conductor.

3. The semiconductor memory according to claim 2, wherein the insulating structure does not separate any of the first conductors below the second and third conductors.

4. The semiconductor memory according to claim 1, wherein the sixth region of the second conductor and the ninth region of the third conductor are integrally provided.

5. The semiconductor memory according to claim 1, further comprising:
a second stack of fourth conductors stacked in the first direction and separated from each other, the second stack including a tenth region, an eleventh region, and a twelfth region provided in this order along the second direction in parallel to the stack in the first, second, and third regions, respectively;

a fifth conductor extending in the second direction above an uppermost layer of the fourth conductors, the fifth conductor including a thirteenth region, a fourteenth region, and a fifteenth region provided in this order along the second direction;

a sixth conductor extending in the second direction above the uppermost layer of the fourth conductors and provided in the third direction of the fifth conductor, the third direction crossing the first direction and the second direction, the sixth conductor including a sixteenth region, a seventeenth region, and an eighteenth region provided in this order along the second direction;

a plurality of third pillars extending through the eleventh region of the second stack and the fourteenth region of the fifth conductor, and having memory cell regions at intersections with the fourth conductors;

a plurality of fourth pillars extending through the eleventh region of the second stack and the seventeenth region of the sixth conductor, and having memory cell regions at intersections with the fourth conductors;

a third contact plug provided on the thirteenth region of the fifth conductor; and a fourth contact plug provided on the sixteenth region of the sixth conductor, wherein the thirteenth region of the fifth conductor and the sixteenth region of the sixth conductor are separated from each other, the fourteenth region of the fifth conductor and the seventeenth region of the sixth conductor are separated from each other, and the fifteenth region of the fifth conductor and the eighteenth region of the sixth conductor are separated from each other.

* * * * *